United States Patent
Wu et al.

(10) Patent No.: US 12,237,332 B2
(45) Date of Patent: Feb. 25, 2025

(54) INTEGRATED CIRCUIT

(71) Applicant: TAIWAN SEMICONDUCTOR MANUFACTURING CO., LTD., Hsinchu (TW)

(72) Inventors: Guo-Huei Wu, Tainan (TW); Po-Chun Wang, Hsinchu (TW); Hui-Zhong Zhuang, Kaohsiung (TW); Chih-Liang Chen, Hsinchu (TW); Li-Chun Tien, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/343,410

(22) Filed: Jun. 28, 2023

(65) Prior Publication Data

US 2023/0343784 A1  Oct. 26, 2023

Related U.S. Application Data

(60) Continuation of application No. 17/834,752, filed on Jun. 7, 2022, which is a division of application No. (Continued)

(51) Int. Cl.
H01L 27/092 (2006.01)
H01L 23/538 (2006.01)
H01L 29/06 (2006.01)

(52) U.S. Cl.
CPC ........ H01L 27/092 (2013.01); H01L 23/5384 (2013.01); H01L 29/0649 (2013.01)

(58) Field of Classification Search
CPC . H01L 27/092; H01L 27/0688; H01L 27/088; H01L 27/0922; H01L 23/5384;
(Continued)

(56) References Cited

U.S. PATENT DOCUMENTS 5,612,552 A   3/1997  Owens
9,419,003 B1  8/2016  Colinge et al.
(Continued)

FOREIGN PATENT DOCUMENTS

CN   1809914 A    7/2006
CN   106158867 A  11/2016
(Continued)

*Primary Examiner* — Dao H Nguyen
(74) *Attorney, Agent, or Firm* — Maschoff Brennan

(57) ABSTRACT

An integrated circuit is provided and includes first and second gates arranged in first and second layers, wherein the first and second gates extend in a first direction; a first insulating layer interposed between the first and second gates, wherein the first insulating layer, a first portion of the first gate, and a first portion of the second gate overlap with each other in a layout view; a cut layer, different from the first insulating layer, disposed on a second portion of the first gate; a first via passing through the cut layer and coupled to the second portion of the first gate; and a second via overlapping the first portion of the first gate and the first portion of the second gate, and coupled to the second gate. The first and second vias are configured to transmit different control signals to the first and second gates.

20 Claims, 23 Drawing Sheets

Related U.S. Application Data

16/806,978, filed on Mar. 2, 2020, now Pat. No. 11,374,003.

(60) Provisional application No. 62/833,464, filed on Apr. 12, 2019.

(58) Field of Classification Search
CPC .......... H01L 29/0649; H01L 29/66545; H01L 29/42392; H01L 29/78696; H01L 29/0673; H01L 29/66772; H01L 21/823475; H01L 21/823828; H01L 21/823481; H01L 21/8221; H01L 21/823437

See application file for complete search history.

(56) References Cited

U.S. PATENT DOCUMENTS

| | | | |
|---|---|---|---|
| 10,050,062 | B2 | 4/2018 | Sasagawa et al. |
| 9,997,413 | B1* | 6/2018 | Leobandung ......... H01L 27/092 |
| 10,192,867 | B1 | 1/2019 | Frougier et al. |
| 10,297,592 | B2 | 5/2019 | Morrow et al. |
| 10,297,602 | B2 | 5/2019 | Yu et al. |
| 10,304,946 | B2 | 5/2019 | Mehandru et al. |
| 10,553,678 | B2 | 2/2020 | Lee et al. |
| 10,720,363 | B2 | 7/2020 | Ryckaert et al. |
| 10,861,852 | B2 | 12/2020 | Li et al. |
| 11,075,198 | B2 | 7/2021 | Lilak et al. |
| 11,282,861 | B2 | 3/2022 | Nelson et al. |
| 2006/0028861 | A1 | 2/2006 | Han et al. |
| 2006/0062061 | A1 | 3/2006 | Suh et al. |
| 2016/0163870 | A1 | 6/2016 | Ito et al. |
| 2016/0197069 | A1* | 7/2016 | Morrow ................ H01L 29/785 257/393 |
| 2016/0211259 | A1 | 7/2016 | Guo et al. |
| 2017/0069763 | A1 | 3/2017 | Doris et al. |
| 2017/0148922 | A1 | 5/2017 | Hatcher et al. |
| 2018/0138200 | A1* | 5/2018 | Kim ..................... H01L 27/092 |
| 2018/0219082 | A1 | 8/2018 | Guillorn et al. |
| 2018/0315838 | A1 | 11/2018 | Morrow et al. |
| 2018/0342532 | A1 | 11/2018 | Mehandru et al. |
| 2018/0374753 | A1 | 12/2018 | Pawlak et al. |
| 2019/0131394 | A1 | 5/2019 | Reznicek et al. |
| 2019/0172828 | A1* | 6/2019 | Smith ............... H01L 21/28088 |
| 2019/0326175 | A1 | 10/2019 | Lilak et al. |
| 2019/0355756 | A1 | 11/2019 | Nelson et al. |
| 2020/0027959 | A1 | 1/2020 | Cheng et al. |
| 2020/0105751 | A1 | 4/2020 | Dewey et al. |
| 2021/0098500 | A1* | 4/2021 | Wang .................. H01L 21/845 |

FOREIGN PATENT DOCUMENTS

| | | |
|---|---|---|
| CN | 108292675 A | 7/2018 |
| CN | 108878293 A | 11/2018 |
| CN | 108962994 A | 12/2018 |
| CN | 109411408 A | 3/2019 |
| KR | 20160022811 A | 3/2016 |
| KR | 20180018497 A | 2/2018 |
| TW | 201511224 A | 3/2015 |
| TW | 201731025 A | 9/2017 |
| TW | 201733024 A | 9/2017 |
| TW | 201735182 A | 10/2017 |
| WO | 2014209278 A1 | 12/2014 |
| WO | 2018/182615 A1 | 10/2018 |
| WO | 2019/112953 A1 | 6/2019 |

* cited by examiner

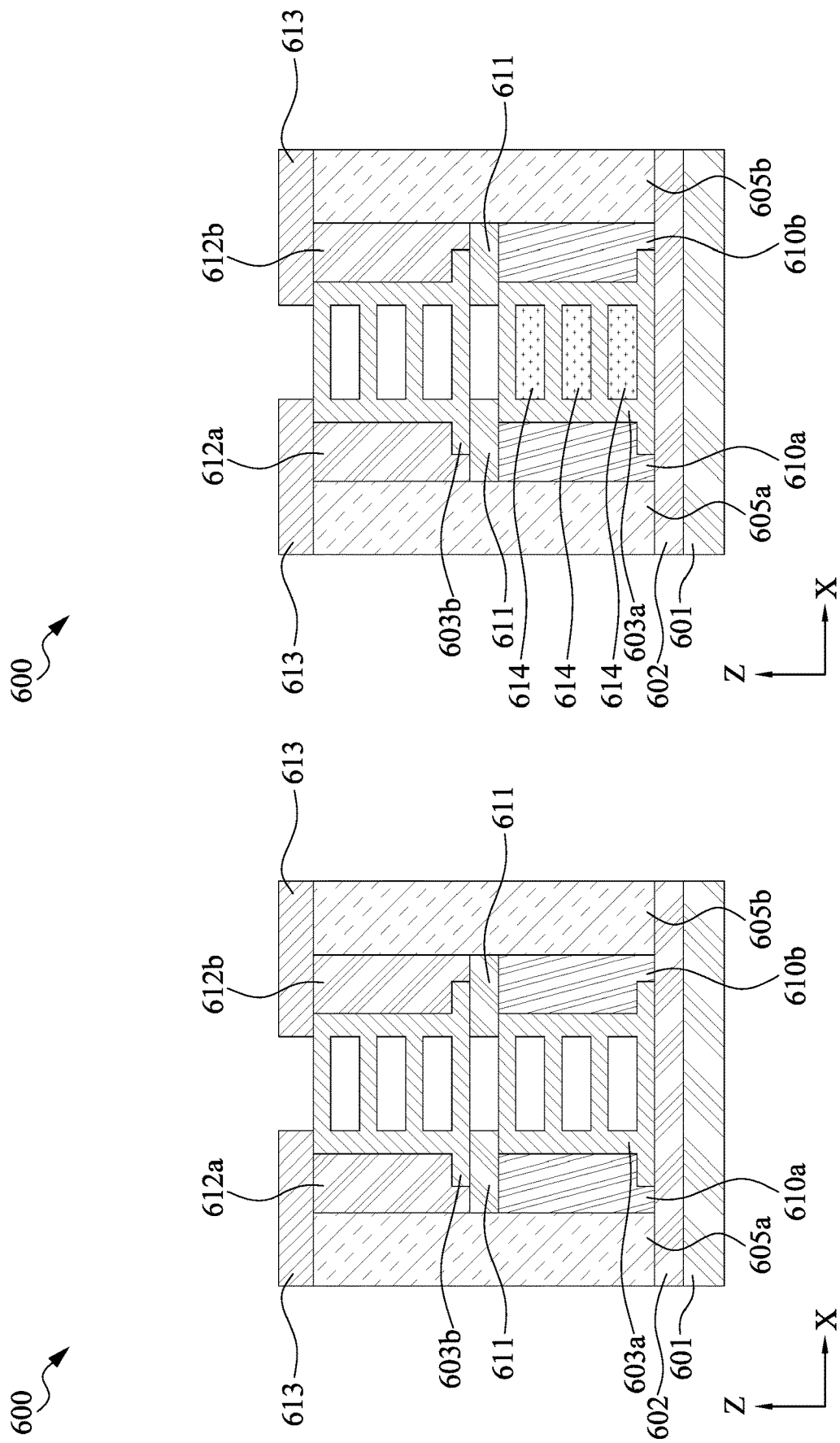

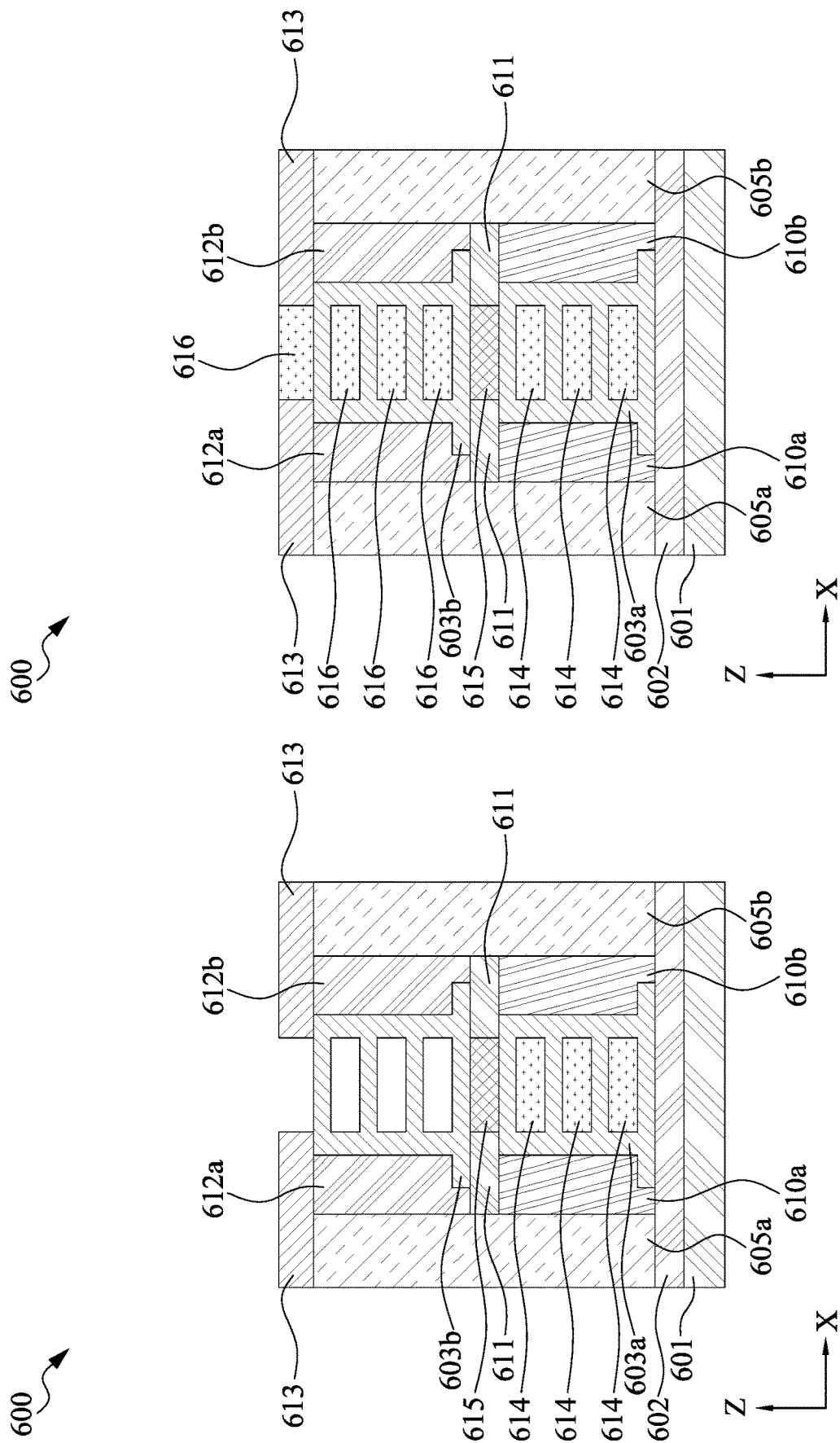

INTEGRATED CIRCUIT

PRIORITY CLAIM AND CROSS-REFERENCE

This application is a continuation application of U.S. application Ser. No. 17/834,752, filed Jun. 7, 2022, which is a divisional application of U.S. application Ser. No. 16/806,978, filed Mar. 2, 2020, now U.S. Pat. No. 11,374,003, issued Jun. 28, 2022, which claims priority to U.S. Provisional Application Ser. No. 62/833,464, filed Apr. 12, 2019, which is herein incorporated by reference.

BACKGROUND

In the development of the semiconductor fabrications, better gate density in integrated circuits is demanded in the progressive process. To achieve better gate density, the complementary field-effect transistor is proposed to reduce cell height by buried power rail and PMOS/NMOS of different depth. However, in some application dummy gate structures are needed in routing and therefore results in extra occupied areas in the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
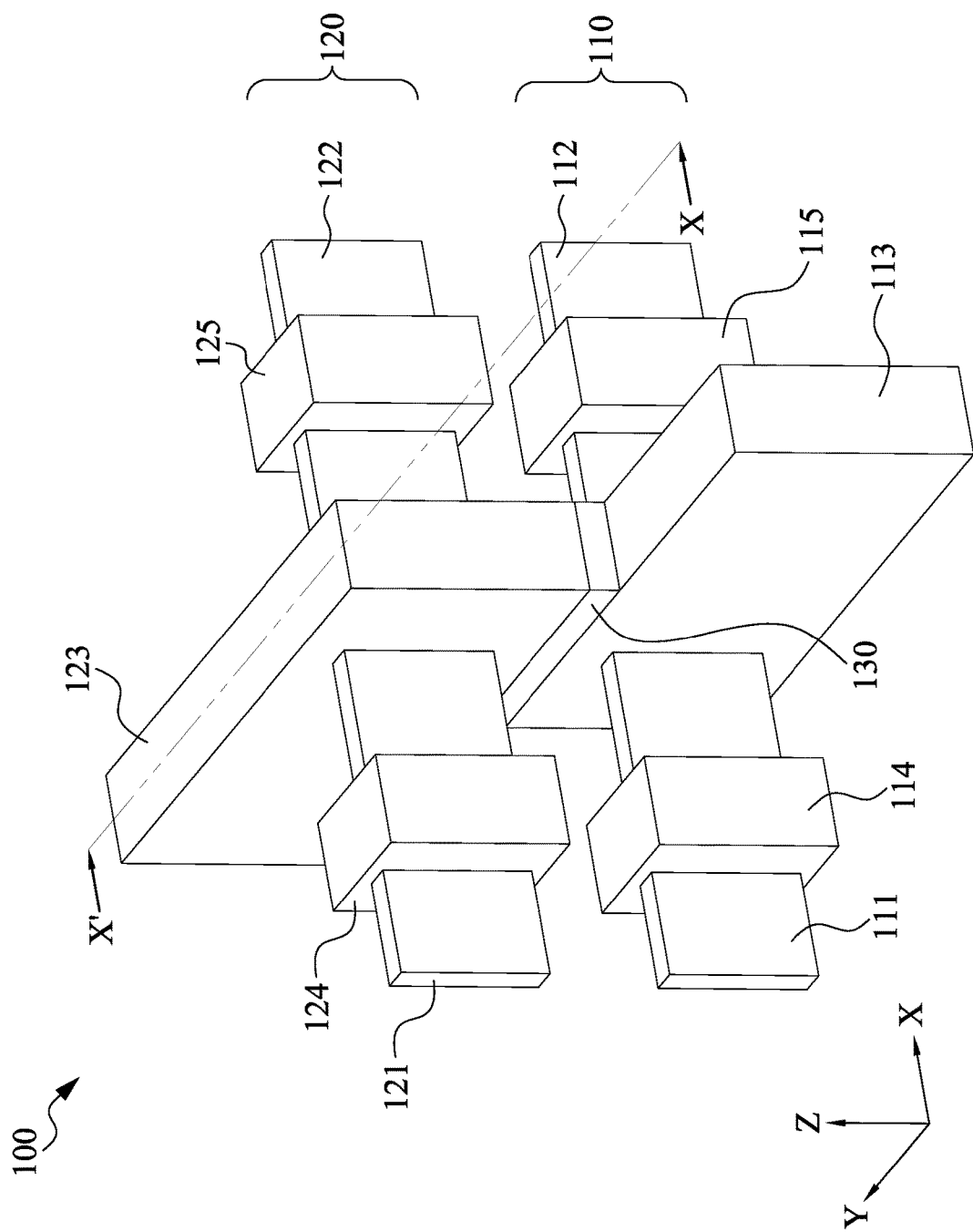
FIG. 1 is a perspective diagram of a part of an integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a perspective diagram of part of an integrated circuit 100, in accordance with various embodiments. For illustration, the integrated circuit 100 includes a transistor 110, a transistor 120, and an insulating layer 130. As shown in FIG. 1, the transistor 120 is disposed above the transistor 110. The insulating layer 130 is disposed between the transistor 110 and the transistor 120. Alternatively stated, the transistors 110 and 120 and the insulating layer 130 are stacked and arranged vertically. In some embodiments, the integrated circuit 100 is a complementary field-effect transistor (CFET). The above implementation of the integrated circuit 100 is given for illustrative purposes. Various implementations of the integrated circuit 100 are within the contemplated scope of the present disclosure. For example, in some embodiments, the integrated circuit 100 is a logic gate circuit including AND, OR, NAND, MUX, Flip-flop, Latch, BUFF, inverter, or any other types of logic circuit.

In some embodiments, the transistor 110 is a first conductivity type FET (e.g., N-type), and the transistor 120 is a second conductivity type FET (e.g., P-type) different from the first conductivity type. However, the scope of the disclosure is not intended to be limiting of the present disclosure. For example, in some embodiments, the transistor 110 is a P-type transistor, and the transistor 120 is an N-type transistor. In other embodiments, the transistors 110 and 120 have the same conductivity type.

For illustration, as shown in FIG. 1, the transistor 110 includes active areas 111-112, a gate 113, and metal over diffusions (MD) 114-115. The transistor 120 includes active areas 121 and 122, a gate 123, and metal over diffusions 124-125. The active areas 111-112 and the metal over diffusions 114-115 are separate from the active areas 121-122 and the metal over diffusions 124-125. The insulating layer 130 is disposed between the gate 113 and the gate 123.

In some embodiments, the insulating layer 130 includes a bottom surface contacting the gate 113 and an upper surface contacting the gate 123. For illustration, the insulating layer 130 is configured to electrically insulate the gate 113 from the gate 123.

In some embodiments, the insulating layer 130 includes, for example, silicon dioxide, silicon nitride, silicon oxycarbide (SiOC) or silicon carbide (SiC) insulating structure. However, the scope of the disclosure is not intended to be limiting of the present disclosure. For example, in various embodiments, the insulating material for the insulating layer 130 includes, for example, SiOCN, SiCN, or any kinds of suitable materials.

In some embodiments, the gates 113 and 123 include a gate dielectric layer (not shown) and a gate electrode layer (not shown). In some embodiments, the gates 113 and 123 are formed around channel regions of the transistors 110 and 120, in which the channel regions include, for example, structures of round/square wire, nanoslab, nano-sheet, multi-bridge channel, nano-ring or any other suitable kinds of the nano structures.

The configurations of the elements in the integrated circuit 100 discussed above are given for illustrative purposes and can be modified depending on the actual implementations. Various configurations of the elements in the integrated circuit 100 are within the contemplated scope of the present disclosure. For example, in some embodiments, the transistor 110 includes additional active areas disposed next to the active areas 111 and 112, and the transistor 120 includes additional active areas disposed next to the active areas 121 and 122.

Figure 2:
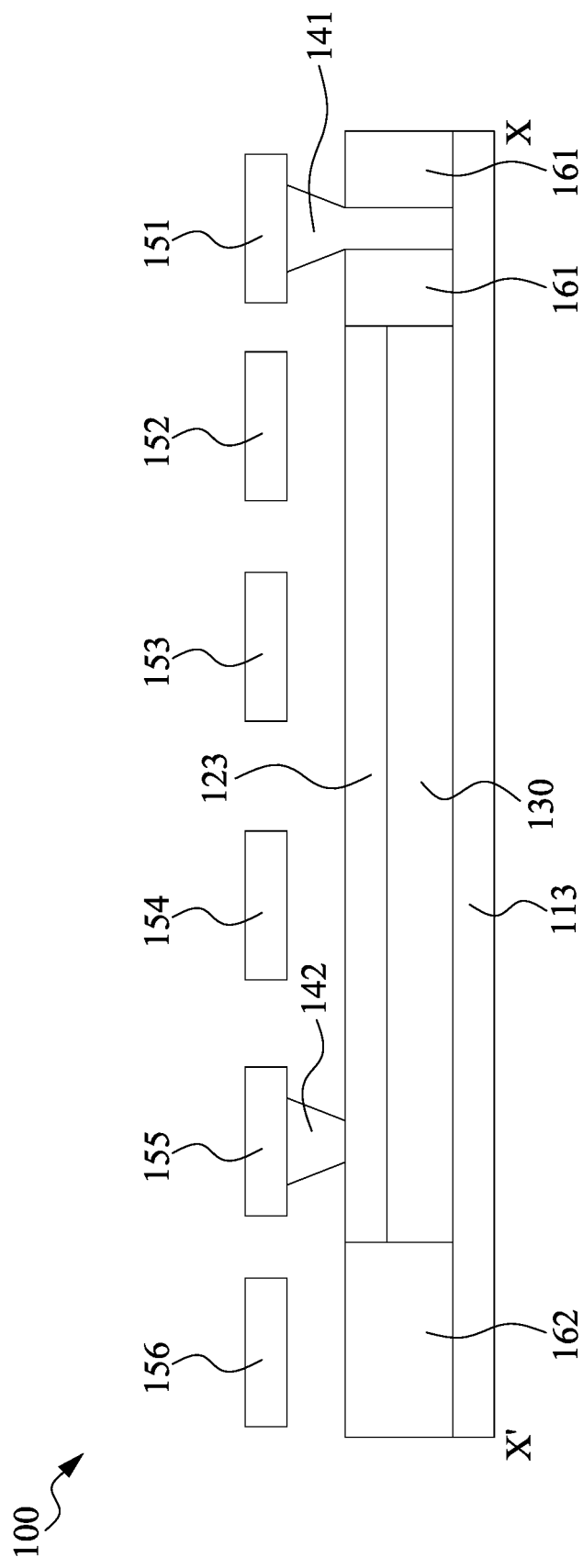
FIG. 2 is a cross-sectional view of part of the integrated circuit in FIG. 1, in accordance with various embodiments.

Reference is now made to FIG. 2. FIG. 2 is a cross-sectional view of part of the integrated circuit 100 along the cross line XX' in FIG. 1, in accordance with various embodiments. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2.

As illustrated in FIG. 2, the integrated circuit 100 further includes vias 141-142, metal-zero segments 151-156, and cut poly layers 161-162. For simplicity of illustration, the metal over diffusions 114-115 and 124-125, and the active areas 111-112 and 121-122 are not shown in FIG. 2.

For illustration, with continued reference to FIG. 2, the via 141 passes through the cut poly layer 161 and is coupled between the gate 113 and the metal-zero segment 151. The via 142 is coupled between the gate 123 and the metal-zero segment 155. In some embodiments, the metal-zero segment 151 is coupled to a first control signal, and the metal-zero segment 155 is coupled to a second control signal different from the first control signal. In such embodiments, the gate 113 of the transistor 110 receives the first control signal, and the transistor 110 operates in response to the first control signal. Similarly, the gate 123 of the transistor 120 receives the second control signal, and the transistor 120 operates in response to the second control signal.

In some approaches, the gates of two transistors as discussed above are coupled together and implemented by a single one gate structure. Because the gates of the two transistors are coupled together and receive the same control signal, extra arrangements including, for example, dummy gates, active areas, metal over diffusions, and/or conductive segments, are required if the two transistors are designed to operate in response to two different control signals. Therefore, extra arrangements occupy a greater area in the integrated circuit, compared to the embodiments of the present disclosure.

Compared to the above approaches, with configurations of the insulating layer 130 to separate the gates 113 and 123 in the embodiments illustrated in FIGS. 1 and 2, the transistors 110 and 120 are able to operate in response to two different control signals, respectively, without extra arrangements. Accordingly, with the configurations as illustrated in FIGS. 1 and 2, the area of the integrated circuit 100 is reduced, compared with some approaches as discussed above.

The configuration of the elements in the integrated circuit 100 discussed above is given for illustrative purposes and can be modified depending on the actual implementations. Various configurations of the elements in the integrated circuit 100 are within the contemplated scope of the present disclosure. For example, in some embodiments, the first control signal received at the gate 113 of the transistor 110 is the same as the second control signal received at the gate 123 of the transistor 120.

Figure 3A:
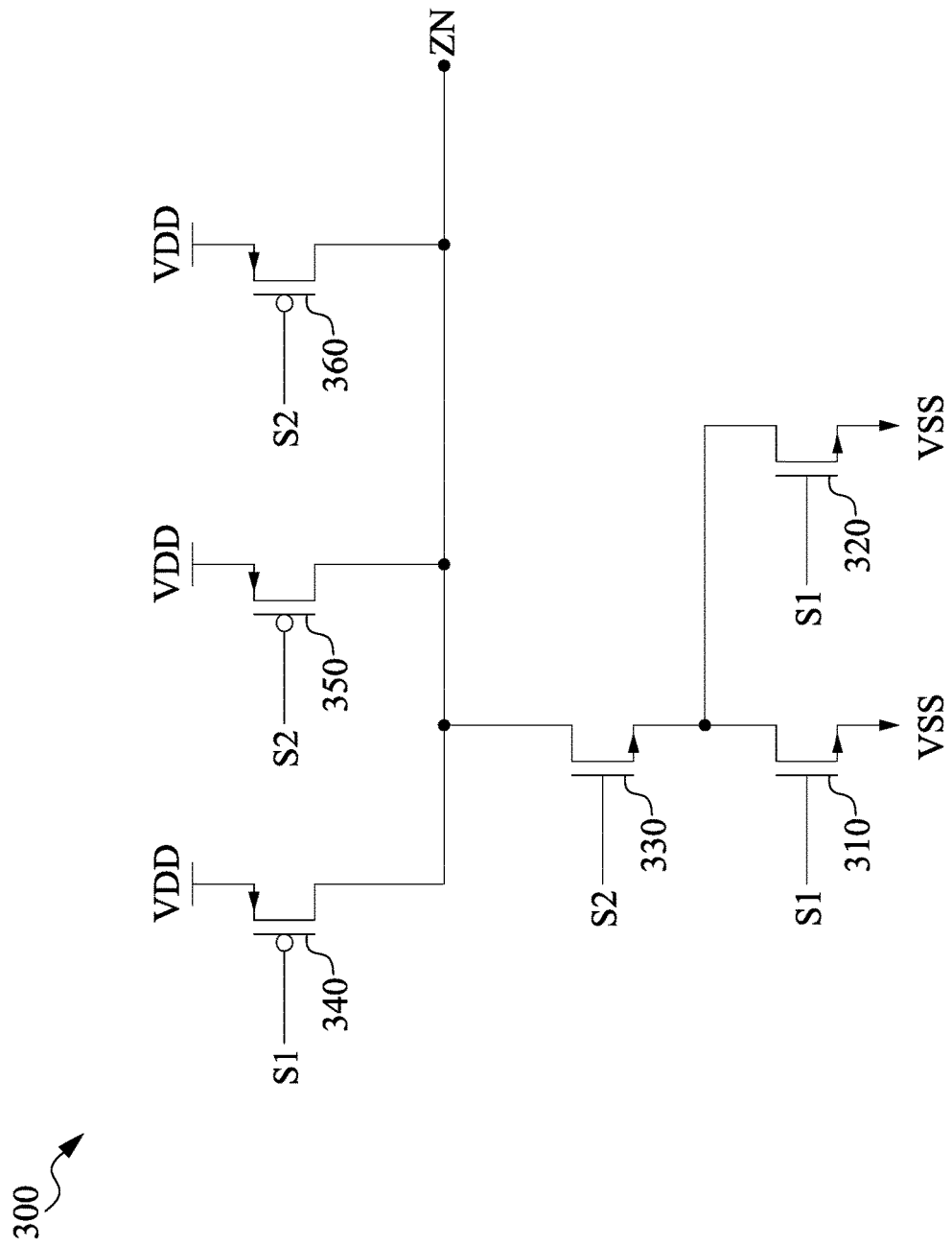
FIG. 3A is an equivalent circuit diagram of a part of an integrated circuit, in accordance with various embodiments.

Reference is now made to FIG. 3A. FIG. 3A is an equivalent circuit diagram of part of an integrated circuit 300, in accordance with various embodiments. For illustration, the integrated circuit 300 includes transistors 310, 320, 330, 340, 350, 360. As shown in FIG. 3A, gates of the transistors 310, 320, and 340 are configured to receive a first control signal S1, and gates of the transistors 330, 350, and 360 are configured to receive a second control signal S2. Sources of the transistors 310 and 320 are coupled to a voltage VSS. Drains of the transistors 310 and 320 are coupled to each other. A source of the transistor 330 is coupled to the drains of the transistors 310 and 320. A drain of the transistor 330 is coupled to drains of the transistors 340, 350, and 360 at an output node ZN. Sources of the transistors 340, 350, and 360 are coupled to a voltage VDD.

In some embodiments, the transistors 310, 320, and 330 are N-type FETs, and the transistors 340, 350, and 360 are P-type FETs. However, the scope of the disclosure is not intended to be limiting of the present disclosure. For example, in some embodiments, the transistors 310, 320, and 330 are P-type transistors, and the transistors 340, 350, and 360 are N-type transistors.

Figure 3B:
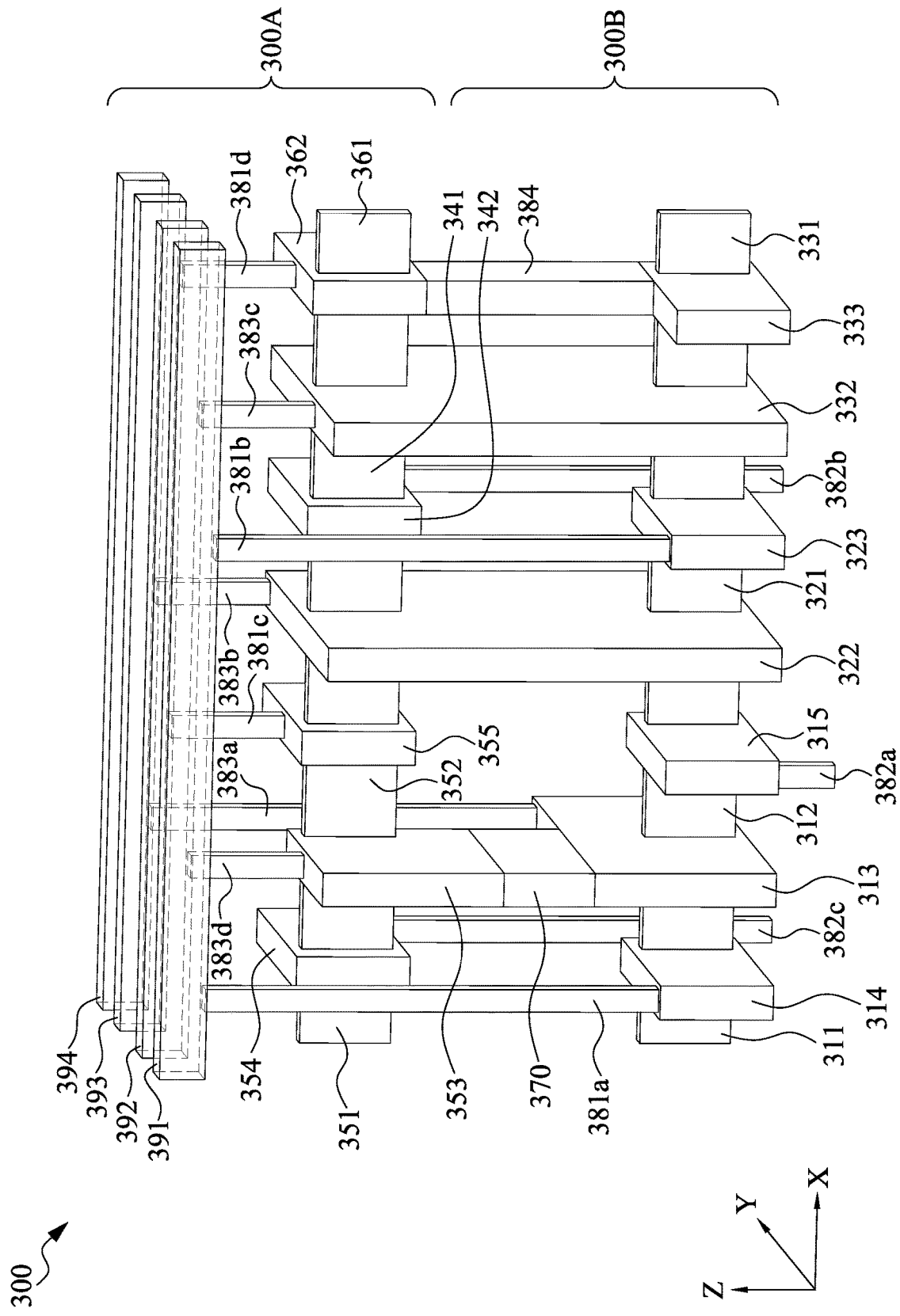
FIG. 3B is a perspective diagram of a part of a semiconductor structure corresponding to the integrated circuit in FIG. 3A, in accordance with various embodiments.

Reference is now made to FIG. 3B. FIG. 3B is a perspective diagram of part of a semiconductor structure corresponding to the integrated circuit 300 in FIG. 3A, in accordance with various embodiments. For illustration, the integrated circuit 300 includes active areas 311-312, 321, 331, 341, 351-352, and 361, gates 313, 322, 332, and 353, metal over diffusions 314-315, 323, 333, 342, 354-355, and 362, an insulating layer 370, vias 381a-381d, 382a-382c, 383a-383d, and 384, and metal-zero segments 391-394. In some embodiments, the active areas 311-312, 321, and 331, the gate 313, and the metal over diffusions 314-315, 323, and 333 are disposed in a first layer. The active areas 341, 351-352, and 361, the gate 353, and the metal over diffusions 342, 354-355, and 362 are disposed in a second layer above the first layer. The gate 322 and the gate 332 extend along z direction from the first layer to the second layer. The metal-zero segments 391-394 are disposed in a third layer above the second layer.

With reference to FIGS. 3A and 3B, the gate 313 is configured as the gate of the transistor 310. The metal over diffusion 314 corresponds to the drain of the transistor 310 that is coupled to the drain of the transistor 320. The metal over diffusion 315 corresponds to the source of the transistor 310 that is coupled to the voltage VSS. The gate 322 is configured as the gate of the transistor 320 and the transistor 340. The metal over diffusion 323 corresponds to the drain of the transistor 320 that is coupled to the drain of the transistor 310. The gate 332 is configured as the gate of the transistor 330 and the gate of the transistor 360. The metal over diffusion 333 corresponds to the drain of the transistor 330 that is coupled to the drain of the transistor 360. The metal over diffusion 342 corresponds to the source of the transistor 340 that is coupled to the voltage VDD. The gate 353 is configured as the gate of the transistor 350. The metal over diffusion 354 corresponds to the source of the transistor 350 that is coupled to the voltage VDD. The metal over diffusion 355 corresponds to the drain of the transistor 350 that is coupled to the output node ZN. The metal over diffusion 362 corresponds to the drain of the transistor 360 that is coupled to the output node ZN.

With continued reference to FIG. 3B, for illustration, the active areas 311-312, 321, 331, 341, 351-352, and 361 extend in x direction that is different from z direction. The active areas 311-312, 321, and 331 are separated from the active areas 351-352, 341, and 361 in z direction. In some embodiments, the active areas 311-312, 321 and 331 overlap the active areas 351-352, 341, and 361 in a plan view or layout view. In some embodiments, the active area 311 and the active area 312 are configured with respect to, for example, the active area 111 and the active area 112 of FIG. 1, respectively. The active area 351 and the active area 352 are configured with respect to, for example, the active area 121 and the active area 122 of FIG. 1, respectively.

For illustration, the metal over diffusions 314-315, 323, 333, 342, 354-355, and 362 extend in y direction that is different from x and z direction. In some embodiments, the metal over diffusions 314 and 315 are configured with respect to, for example, the metal over diffusions 114 and 115 of FIG. 1, respectively. The metal over diffusions 354 and 355 are configured with respect to, for example, the metal over diffusions 124 and 125 of FIG. 1, respectively. As shown in FIG. 3B, the metal over diffusions 314 and 315 are coupled to the active areas 311 and 312, respectively. The metal over diffusion 323 is coupled to the active area 321. The metal over diffusion 333 is coupled to the active area 331. The metal over diffusion 342 is coupled to the active area 341. The metal over diffusions 354 and 355 are coupled to the active areas 351 and 352, respectively. The metal over diffusion 362 is coupled to the active area 361. In some embodiments, the metal over diffusions 314-315, 323, 333, 342, 354-355, and 362 are penetrated by the corresponding active areas coupled thereto. In some embodiments, in a plan view, the metal over diffusion 314 partially overlaps the metal over diffusion 354, the metal over diffusion 315 partially overlaps the metal over diffusion 355, the metal over diffusion 323 partially overlaps the metal over diffusion 342, and the metal over diffusion 333 partially overlaps the metal over diffusion 362.

For illustration, the gate 313 and the gate 353 extend in y direction. As shown in FIG. 3B, the gate 313 and the gate 353 are separated from each other in z direction by the insulating layer 370 therebetween. In some embodiments, the gate 313 and the gate 353 are configured with respect to, for example, the gate 113 and the gate 123 of FIGS. 1 and 2, respectively. In some embodiments, a width of the gate 313 is longer than a width of the gate 353 along y direction. To explain in a different way, the gate 313 and the gate 353 partially overlap with each other in a plan view. However, the scope of the disclosure is not intended to be limiting of the present disclosure. For example, in some embodiments, the gate 353 extends along y direction in a direction opposite to the direction in which the gate 313 extends, and has a width equal to the width of the gate 313 along y direction.

As illustrated in FIG. 3B, the gate 322 and the gate 332 are disposed next to the gates 313 and 353 along x direction. The gates 322 and the gate 332 extend in z direction and are separated from each other in x direction.

For illustration, the insulating layer 370 extends in y direction. In some embodiments, the insulating layer 370 is configured with respect to, for example, the insulating layer 130 of FIGS. 1 and 2. In other embodiments, the insulating layer 370 overlaps the gate 313 with a greater area compared to the gate 353. However, the scope of the disclosure is not intended to be limiting of the present disclosure. For example, in some embodiments, the insulating layer 370 overlaps the gate 313 and the gate 353 with the equal area while the gate 353 has a width equal to the width of the gate 313 along y direction.

The vias 381a-381d, 382a-382c, 383a-383d, and 384 extend in z direction. The via 381a is coupled between the metal over diffusion 314 and the metal-zero segment 391. The via 381b is coupled between the metal over diffusion 323 and the metal-zero segment 391. Therefore, the active area 311 is coupled to the active area 321 through the metal over diffusion 314, the via 381a, the metal-zero segment 391, the via 381b, and the metal over diffusion 323. The via 381c and the via 381d are coupled to the metal over diffusion 355 and the metal over diffusion 362, respectively. The vias 381c and 381d are coupled to each other through being coupled to the metal-zero segment 393.

The via 382a is coupled to the metal over diffusion 315 and the voltage VSS. The via 382b is coupled to the metal over diffusion 342 and the voltage VDD. The via 382c is coupled to the metal over diffusion 354 and the voltage VDD.

The via 383a is coupled between the gate 313 and the metal-zero segment 394. The via 383b is coupled between the gate 322 and the metal-zero segment 394. The via 383c is coupled between the gate 332 and the metal-zero segment 392. The via 383*d* is coupled between the gate 353 and the metal-zero segment 392. As shown in FIG. 3B, the via 383*a* and the via 383*d* are separated from each other along y direction. In some embodiments, the via 383*a* and the via 383*d* are configured with respect to, for example, the via 141 and the via 142 of FIG. 2, respectively.

The via 384 is coupled between the metal over diffusion 333 and the metal over diffusion 362. Therefore, the active area 331 is coupled to the active area 361 through the metal over diffusion 333, the via 384, and the metal over diffusion 362.

The metal-zero segments 391-394 extend in x direction and are separated from each other along y direction. In some embodiments, the metal-zero segment 392 is coupled to a signal output to transmit the second control signal S2 to the corresponding gates 332 and 353. The metal-zero segment 394 is coupled to another signal output to transmit the first control signal S1 to the corresponding gates 313 and 322. The metal-zero segment 393 is configured for the formation of the structure corresponding to the output node ZN of FIG. 3A.

Figure 3C:
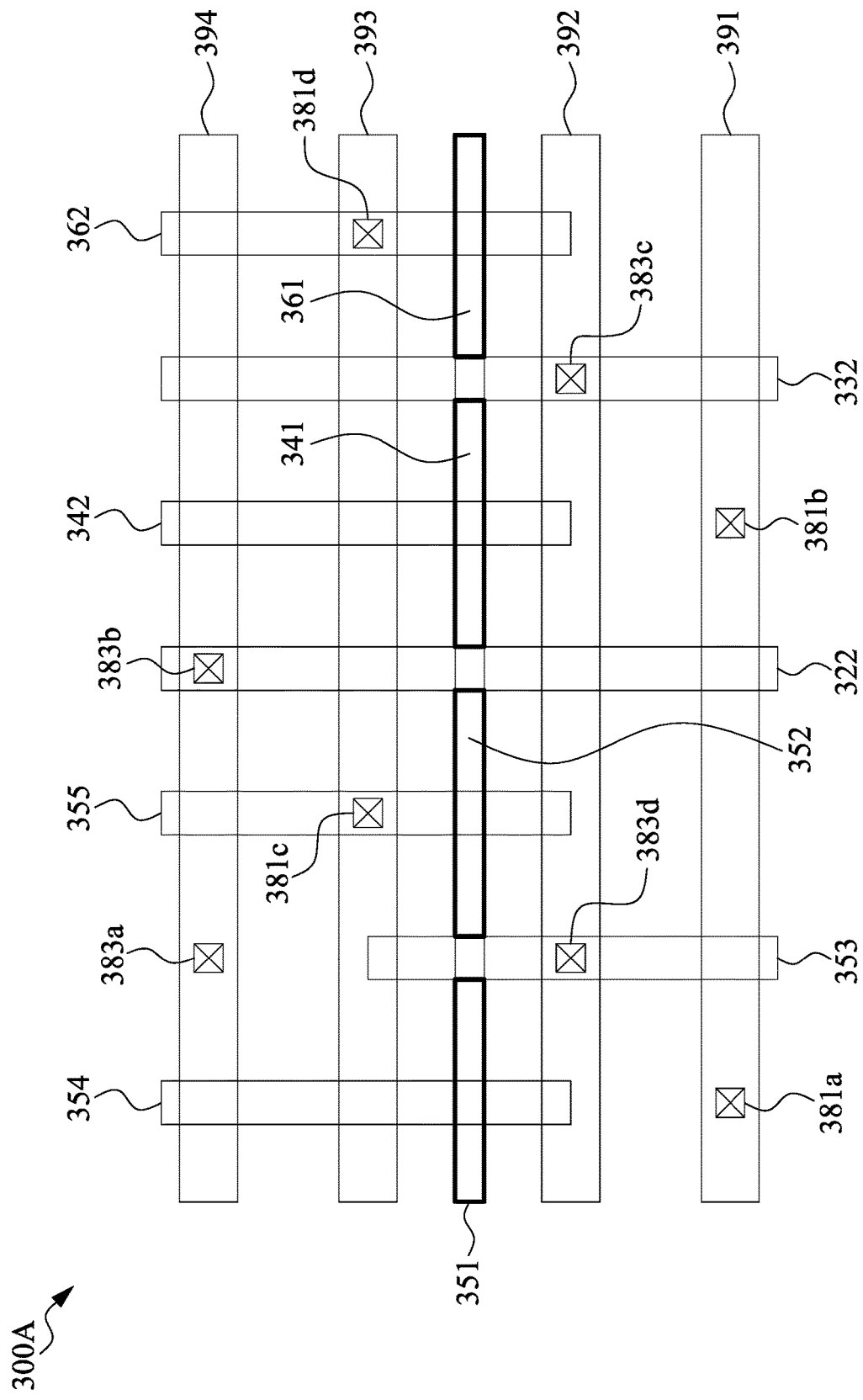
FIG. 3C is a layout diagram in a plan view of part of the integrated circuit corresponding to a part of FIG. 3B, in accordance with various embodiments.

Reference is now made to FIG. 3C. FIG. 3C is a layout diagram in a plan view of part of the integrated circuit 300, corresponding to the part 300A of FIG. 3B, in accordance with various embodiments. With respect to the embodiments of FIG. 3B, like elements in FIG. 3C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3C.

As shown in FIG. 3C, the integrated circuit 300 includes the active areas 341, 351-352, and 361, the metal over diffusions 342, 354-355, and 362, the gates 322, 332, and 353, the vias 381*a*-381*d*, 383*b*, and 383*c*, and the metal-zero segments 391-394. For illustration, the gate 322 crosses the active areas 341 and 352, the gate 332 crosses the active areas 341 and 361, and the gate 353 crosses the active areas 351-352. The metal-zero segment 391 overlaps the vias 381*a* and 381*b*. The metal-zero segment 392 overlaps the vias 383*c* and 383*d*. The metal-zero segment 393 overlaps the vias 381*c* and 381*d*. The metal-zero segment 394 overlaps the vias 383*a* and 383*b*.

Figure 3D:
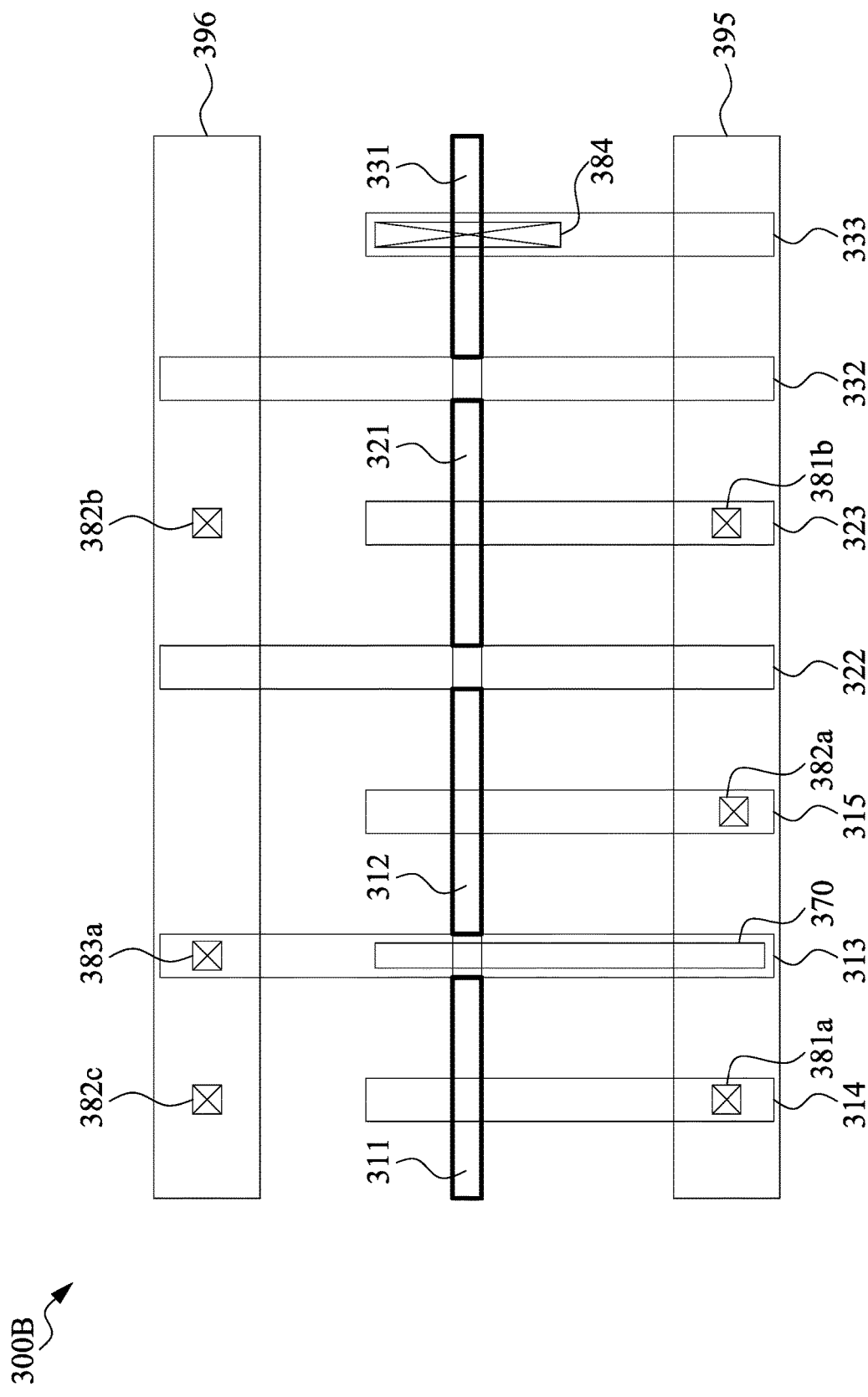
FIG. 3D is a layout diagram in a plan view of part of the integrated circuit corresponding to a part of FIG. 3B, in accordance with various embodiments.

Reference is now made to FIG. 3D. FIG. 3D is a layout diagram in a plan view of part of the integrated circuit 300 corresponding to the part 300B of FIG. 3B, in accordance with various embodiments. With respect to the embodiments of FIG. 3B, like elements in FIG. 3D are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3D.

As shown in FIG. 3D, the integrated circuit 300 includes the active areas 311-312, 321, and 331, the gates 313, 332, and 332, the metal over diffusions 314-315, 323, and 333, the insulating layer 370, the vias 381*a*-381*b*, 382*a*-382*c*, 383*a*, and 384, and power rails 395-396. For illustration, the gate 313 crosses the active areas 311 and 312, the gate 322 crosses the active areas 312 and 321, and the gate 332 crosses the active areas 321 and 331. The via 384 overlaps the metal over diffusion 333. The metal-zero segment 391 overlaps the vias 381*a* and 381*b*. The metal-zero segment 392 overlaps the vias 383*c* and 383*d*. The metal-zero seg-ment 393 overlaps the vias 381*c* and 381*d*. The metal-zero segment 394 overlaps the vias 383*a* and 383*b*.

The power rails 395-396 extend in x direction and are separated from each other in y direction. The power rail 395 overlaps the vias 381*a*-381*b* and 382*a*, and the power rail 396 overlaps the vias 382*b*-382*c* in a plan view. In some embodiments, the power rails 395-396 are disposed below the active areas 311-312, 321, and 331, the gates 313, 332, and 332, the metal over diffusions 314-315, 323, and 333, and the vias 381*a*-381*b*, 382*a*-382*c*. The power rail 395 is coupled to the via 382*a* to receive the voltage VSS for the integrated circuit 300, and the power rail 396 is coupled to the vias 382*b*-382*c* to output the voltage VDD to the integrated circuit 300.

In some approaches, at least four gates with corresponding elements, including, for example, active areas and metal over diffusions, are required to implement the equivalent circuit of FIG. 3A. Specifically, the at least four gates are separated from each other in x direction. Thus, the at least four gates with corresponding elements in those approaches occupy a greater area in a plan view, compared with the integrated circuit 300 of the present disclosure.

Compared to the above approaches, with configurations illustrated in FIGS. 3A, 3B, 3C and 3D, the gate 313 and the gate 353 are stacked vertically and overlap each other. Therefore, in a plan view, the required area for the gate 313 and the gate 353 of the integrated circuit 300 is reduced. Accordingly, the required area for the gate 313 and the gate 353 with corresponding elements, including the active areas and the metal over diffusions, as shown in FIGS. 3B, 3C, and 3D, is reduced.

The configuration of FIGS. 3A, 3B, 3C, and 3D are given for illustrative purposes. Various configurations of the elements mentioned above in FIGS. 3A, 3B, 3C, and 3D are within the contemplated scope of the present disclosure. For example, in various embodiments, the insulating layer 370 extends in x direction and overlaps the metal over diffusions 315 and 355 in a plan view.

Figure 4A:
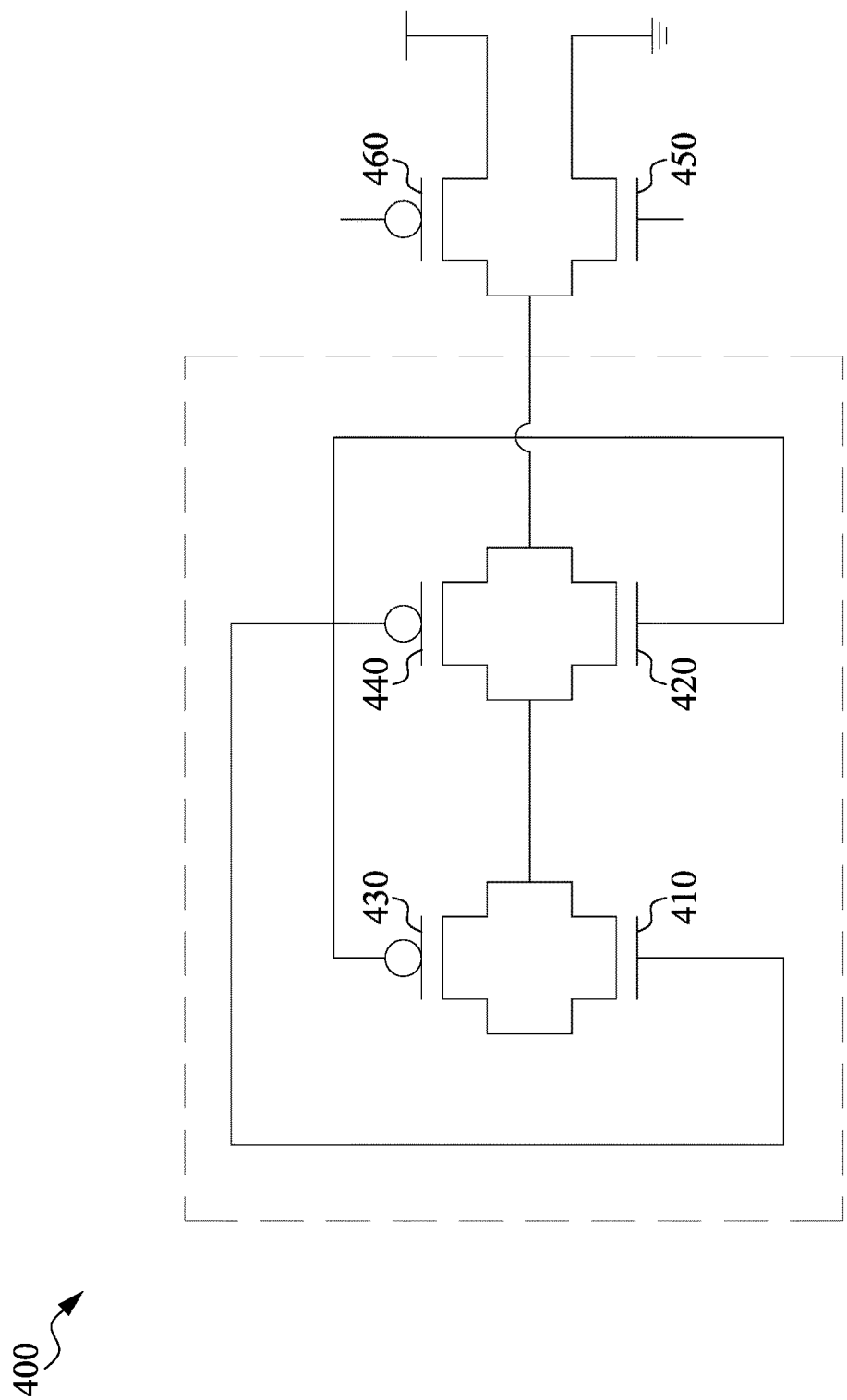
FIG. 4A is an equivalent circuit diagram of part of an integrated circuit in FIG. 4B, in accordance with various embodiments.

Reference is now made to FIG. 4A. FIG. 4A is an equivalent circuit diagram of part of an integrated circuit 400, in accordance with various embodiments. For illustration, the integrated circuit 400 includes transistors 410, 420, 430, 440, 450, 460. As shown in FIG. 4A, a gate of the transistor 410 is coupled to a gate of the transistor 440, a first source/drain of the transistor 410 is coupled to a first source/drain of the transistor 430, and a second source/drain of the transistor 410 is coupled a first source/drain of the transistor 420, a second source/drain of the transistor 430, and a first source/drain of the transistor 440. A gate of the transistor 420 is coupled to a gate of the transistor 430, and a second source/drain of the transistor 420 is coupled to a second source/drain of the transistor 440, a first source/drain of the transistor 450, and a first source/drain of the transistor 460. A second source/drain of the transistor 450 is coupled to a ground, and a second source/drain of the transistor 460 is coupled to a voltage supply. In some embodiments, the integrated circuit 400 is a transmission gate. However, the scope of the disclosure is not intended to be limiting of the present disclosure.

In some embodiments, the transistors 410, 420, and 450 are N-type FETs, and the transistors 430, 440, and 460 are P-type FETs. However, the scope of the disclosure is not intended to be limiting of the present disclosure. For example, in some embodiments, the transistors 410, 420, and 450 are P-type transistors and the transistors 430, 440, and 460 are N-type transistors.

Figure 4B:
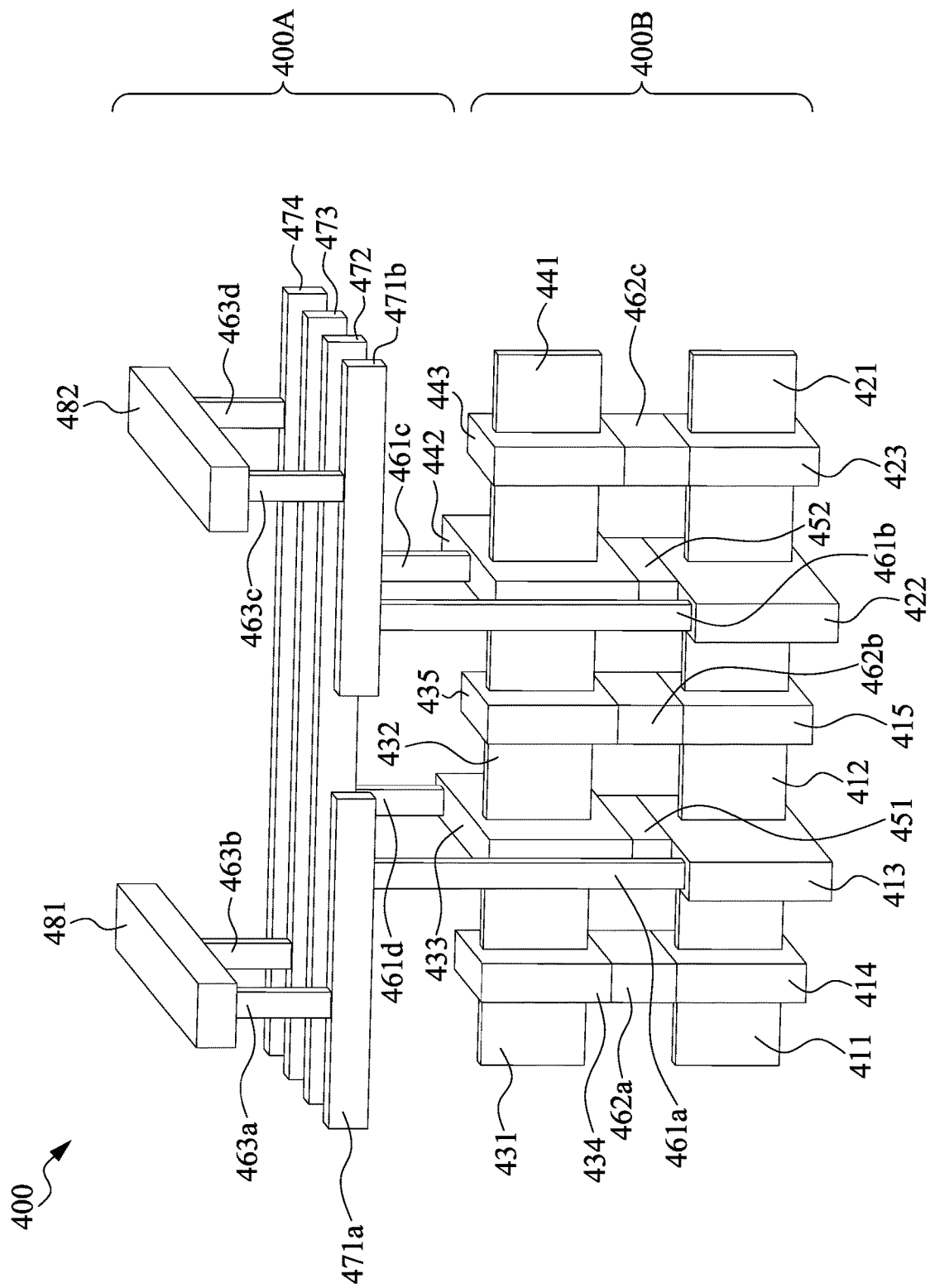
FIG. 4B is a perspective diagram of part of a semiconductor structure corresponding to the integrated circuit in FIG. 4A, in accordance with various embodiments.

Reference is now made to FIG. 4B. FIG. 4B is a perspective diagram of a part of a semiconductor structure corresponding to a part of the integrated circuit 400 circled by a dash line in FIG. 4A, in accordance with various embodiments. For illustration, the integrated circuit 400 includes active areas 411-412, 421, 431-432, and 441, gates 413, 422, 433, and 442, metal over diffusions 414-415, 423, 434-435, and 443, insulating layers 451-452, vias 461a-461d, 462a-462c, and 463a-463d, metal-zero segments 471a-471b, and 472-474, and metal-one segments 481-482. In some embodiments, the active areas 411-412, and 421, the gates 413 and 422, and the metal over diffusions 414-415, and 423 are disposed in a first layer. The active areas 431-432, and 441, the gates 433 and 442, and the metal over diffusions 434-435, and 443 are disposed in a second layer above the first layer. The metal-zero segments 471a-471b, and 472-474 are disposed in a third layer above the second layer. The metal-one segments 481-482 are disposed in a fourth layer above the third layer.

With reference to FIGS. 4A and 4B, the metal over diffusion 414 corresponds to the first source/drain of the transistor 410. The metal over diffusion 415 corresponds to the second source/drain of the transistor 410 and the first source/drain of the transistor 420. The gate 413 is configured as the gate of the transistor 410. The metal over diffusion 423 corresponds to the second source/drain of the transistor 420. The gate 422 is configured as the gate of the transistor 420. The metal over diffusion 434 corresponds to the first source/drain of the transistor 430. The metal over diffusion 435 corresponds to the second source/drain of the transistor 430 and the first source/drain of the transistor 440. The gate 433 is configured as the gate of the transistor 430. The metal over diffusion 443 corresponds to the second source/drain of the transistor 440. The gate 442 is configured as the gate of the transistor 440.

With reference to FIGS. 4A and 4B, the gate 413 is configured as the gate of the transistor 410. The metal over diffusion 414 corresponds to the first source/drain of the transistor 410 that is coupled to a terminal of the transistor 430. The metal over diffusion 415 corresponds to the second source/drain of the transistor 410 that is coupled to a terminal of the transistor 430.

With continued reference to FIG. 4B, for illustration, the active areas 411-412, 421, 431-432, and 441 extend in x direction. The active areas 411-412 and 421 are separated from the active areas 431-432 and 441 in Z direction. In some embodiments, the active areas 411-412 and 421 overlap the active areas 431-432 and 441 in a plan view or layout view. In some embodiments, the active area 411 and the active area 412 are configured with respect to, for example, the active area 111 and the active area 112 of FIG. 1, respectively. The active area 431 and the active area 432 are configured with respect to, for example, the active area 121 and the active area 122 of FIG. 1, respectively. Furthermore, in some embodiments, the active area 412 and the active area 421 are configured with respect to, for example, the active area 111 and the active area 112 of FIG. 1, respectively. The active area 432 and the active area 441 are configured with respect to, for example, the active area 121 and the active area 122 of FIG. 1, respectively.

For illustration, the metal over diffusions 414-415, 423, 434-435, and 443 extend in y direction. In some embodiments, the metal over diffusions 414 and 415 are configured with respect to, for example, the metal over diffusions 114, 115 of FIG. 1. The metal over diffusions 434 and 435 are configured with respect to, for example, the metal over diffusions 124, 125 of FIG. 1. In some embodiments, the metal over diffusions 415 and 423 are configured with respect to, for example, the metal over diffusions 114, 115 of FIG. 1. The metal over diffusions 435 and 443 are configured with respect to, for example, the metal over diffusions 124, 125 of FIG. 1. As shown in FIG. 4B, the metal over diffusions 414 and 415 are coupled to the active areas 411 and 412 respectively. The metal over diffusion 423 is coupled to the active area 421. The metal over diffusions 434 and 435 are coupled to the active areas 431 and 432 respectively. The metal over diffusion 443 is coupled to the active area 441. In some embodiments, the metal over diffusions 414-415, 423, 434-435, and 443 are penetrated by the corresponding active areas coupled thereto. In some embodiments, in a plan view, the metal over diffusion 414 overlaps the metal over diffusion 434, the metal over diffusion 415 overlaps the metal over diffusion 435, and the metal over diffusion 423 overlaps the metal over diffusion 443.

For illustration, the gates 413, 422, 433 and 442 extend in y direction. As shown in FIG. 4B, the gate 413 and the gate 433 are separated from each other in z direction by the insulating layer 451 therebetween. The gate 422 and the gate 442 are separated from each other in z direction by the insulating layer 452 therebetween. In some embodiments, the gate 413 and the gate 422 are configured respectively with respect to, for example, the gate 113 of FIGS. 1 and 2. The gate 433 and the gate 442 are configured respectively with respect to, for example, the gate 123 of FIGS. 1 and 2. In some embodiments, in a plan view, the gate 413 and the gate 433 partially overlap with each other, and the gate 422 and the gate 442 partially overlap with each other. However, the scope of the disclosure is not intended to be limiting of the present disclosure. For example, in some embodiments, a width of the gates 413 and 422 is different from a width of the gates 433 and 442 along x direction.

The insulating layers 451-452 extend in y direction. In some embodiments, the insulating layers 451-452 are configured with respect to, for example, the insulating layer 130 of FIGS. 1 and 2. In some embodiments, the insulating layer 451 electrically insulates the gate 413 from the gate 433, and the insulating layer 452 electrically insulates the gate 422 from the gate 442.

The via 461a is coupled between the gate 413 and the metal-zero segment 471b. The via 461b is coupled between the gate 422 and the metal-zero segment 471b. The via 461c is coupled between the gate 442 and the metal-zero segment 473. The via 461d is coupled between the gate 433 and the metal-zero segment 474. As shown in FIG. 4B, the via 461a and the via 461d are separated from each other along y direction, and the via 461b and the via 461c are separated from each other along y direction. In some embodiments, the via 461a and the via 461d are configured with respect to, for example, the via 141 and the via 142 of FIG. 2, respectively. The via 461b and the via 461c are configured with respect to, for example, the via 141 and the via 142 of FIG. 2, respectively.

The via 462a is coupled between the metal over diffusion 414 and the metal over diffusion 434. Therefore, the active area 411 is coupled to the active area 431 through the metal over diffusion 414, the via 462a, and the metal over diffusion 434. The via 462b is coupled between the metal over diffusion 415 and the metal over diffusion 435. Therefore, the active area 412 is coupled to the active area 432 through the metal over diffusion 415, the via 462b, and the metal over diffusion 435. The via 462c is coupled between the metal over diffusion 423 and the metal over diffusion 443.

Therefore, the active area 421 is coupled to the active area 441 through the metal over diffusion 423, the via 462c, and the metal over diffusion 443.

The metal-zero segments 471a-471b and 472-474 extend in x direction and are separated from each other along y direction. The metal-one segments 481-482 extend in y direction and are separated from each other along x direction.

The via 463a is coupled between the metal-zero segment 471a and the metal-one segment 481. The via 463b is coupled between the metal-zero segment 473 and the metal-one segment 481. The via 463c is coupled between the metal-zero segment 471b and the metal-one segment 482. The via 463d is coupled between the metal-zero segment 474 and the metal-one segment 482.

As discussed above, accordingly, the gate 413 in the first layer is coupled to the gate 442 in the second layer through the via 461a, the metal-zero segment 471a, the via 463a, the metal-one segment 481, the via 463b, the metal-zero segment 473, and the via 461c. The gate 422 in the first layer is coupled to the gate 433 in the second layer through the via 461b, the metal-zero segment 471b, the via 463c, the metal-one segment 482, the via 463d, the metal-zero segment 474, and the via 461d.

Figure 4C:
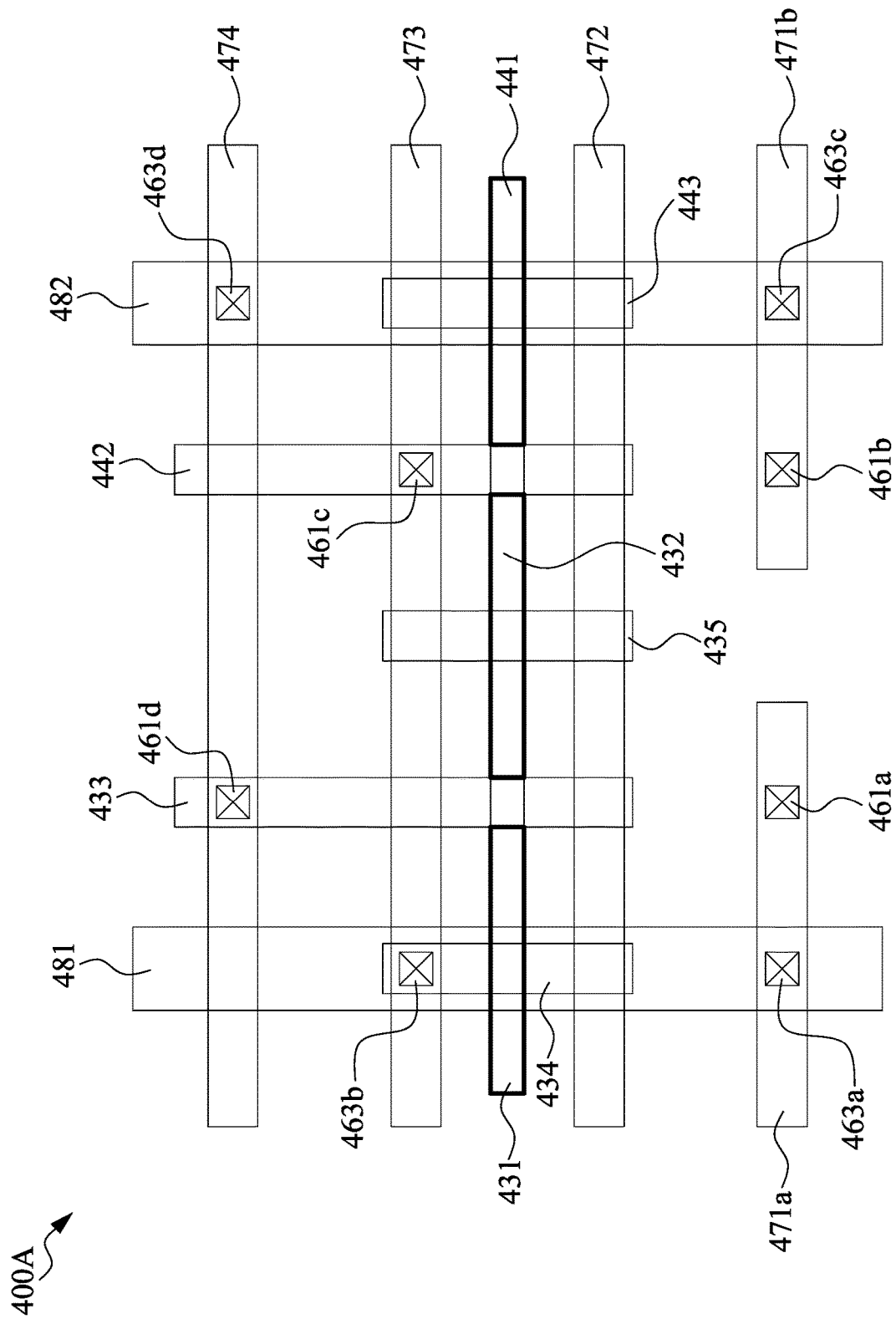
FIG. 4C is a layout diagram in a plan view of part of the integrated circuit corresponding to a part of FIG. 4B, in accordance with various embodiments.

Reference is now made to FIG. 4C. FIG. 4C is a layout diagram in a plan view of part of the integrated circuit 400 corresponding to the part 400A of FIG. 4B, in accordance with various embodiments. With respect to the embodiments of FIG. 4B, like elements in FIG. 4C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4C.

As shown in FIG. 4C, the integrated circuit 400 includes the active areas 431-432 and 441, the metal over diffusions 434-435 and 443, the gates 433 and 442, the vias 461a-461d and 463a-463d, the metal-zero segments 471a-471b and 472-474, and the metal-one segments 481-482. For illustration, the gate 433 crosses the active areas 431 and 432, and the gate 442 crosses the active areas 432 and 441. The metal-zero segment 471a overlaps the vias 461a and 463a. The metal-zero segment 471b overlaps the vias 461b and 463c. The metal-zero segment 473 overlaps the vias 463b and 461c. The metal-zero segment 474 overlaps the vias 461d and 463d.

Figure 4D:
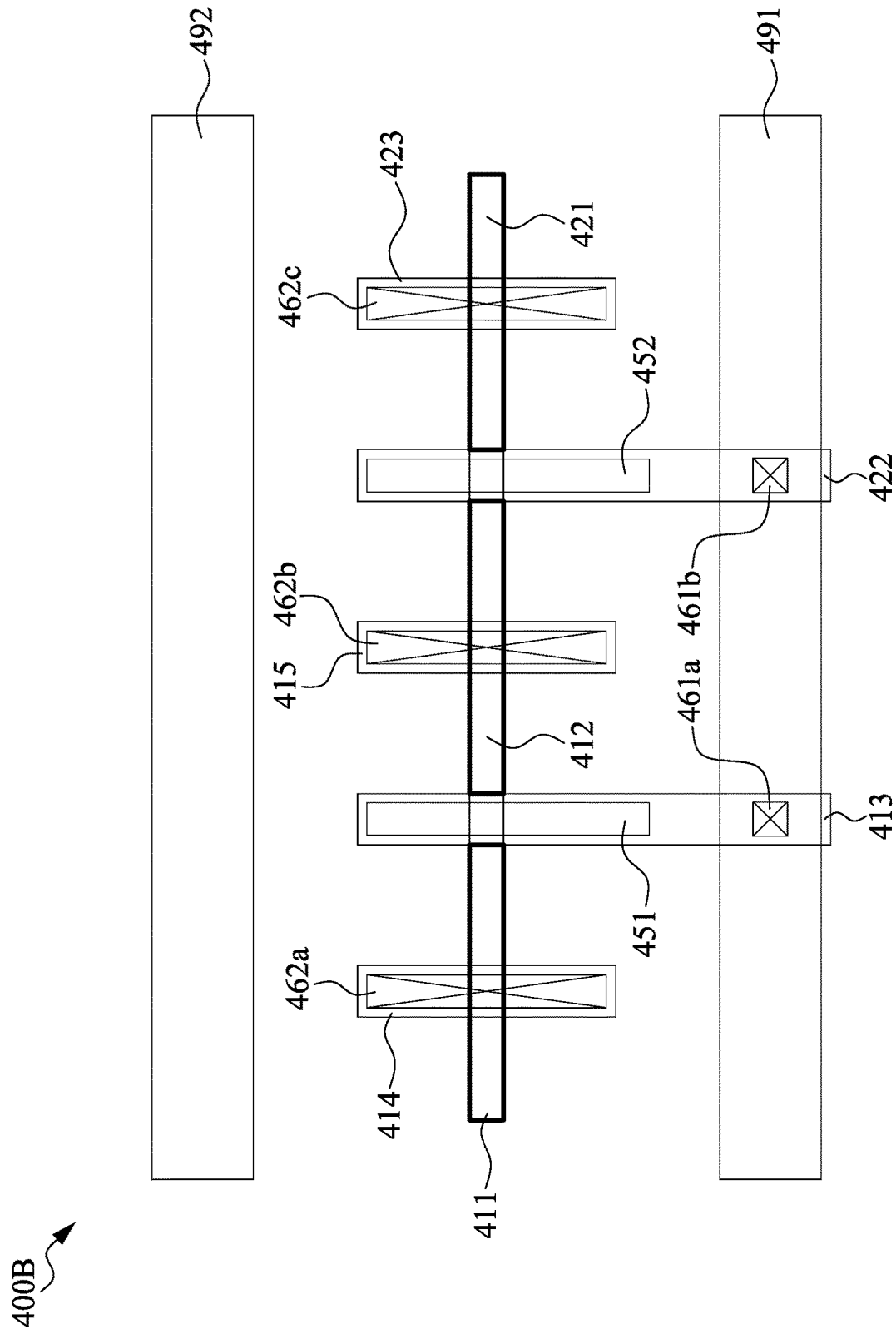
FIG. 4D is a layout diagram in a plan view of part of the integrated circuit corresponding to a part of FIG. 4B, in accordance with various embodiments.

Reference is now made to FIG. 4D. FIG. 4D is a layout diagram in a plan view of part of the integrated circuit 400 corresponding to the part 400B of FIG. 4B, in accordance with various embodiments. With respect to the embodiments of FIG. 4B, like elements in FIG. 4D are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4D.

As shown in FIG. 4D, the integrated circuit 400 includes the active areas 411-412 and 421, the gates 413 and 422, the metal over diffusions 414-315 and 423, the insulating layers 451-452, the vias 462a-462c, and power rails 491-492. For illustration, the gate 413 crosses the active areas 411 and 412, and the gate 422 crosses the active areas 412 and 421. The gate 413 overlaps the insulating layer 451 and the via 461a, and the gate 422 overlaps the insulating layer 452 and the via 461b. The via 462a overlaps the metal over diffusion 414, the via 462b overlaps the metal over diffusion 415, and the via 462c overlaps the metal over diffusion 423.

The power rails 491-492 extend in x direction and are separated from each other in y direction. In some embodiments, the power rails 491-492 are disposed below the active areas 411-412, and 421, the gates 413 and 422, the metal over diffusions 414-415 and 423, and the vias 461a-461b and 462a-462c. The power rail 491 is coupled to a via (not shown) to receive a voltage VSS for the integrated circuit 400, and the power rail 492 is coupled to another via (not shown) to receive a voltage VDD for the integrated circuit 400.

In some approaches, at least three gates with corresponding elements, including, for example, active areas and metal over diffusions, are required to implement the equivalent circuit of FIG. 4A. Specifically, the at least three gates are separated from each other in x direction. Thus, the at least three gates with corresponding elements in those approaches occupy a greater area in a plan view, compared with the integrated circuit 400 of the present disclosure.

Compared to the above approaches, with configurations illustrated in FIGS. 4A, 4B, 4C and 4D, the gate 413 and the gate 433 are stacked vertically and overlap each other, and the gate 422 and the gate 442 are stacked vertically and overlap each other. Therefore, in a plan view the required area for the gates 413, 422, 433 and 442 of the integrated circuit 400 is reduced. Accordingly, the required area for the gates 413, 422, 433 and 442 with corresponding elements, including the active areas and the metal over diffusions, as shown in FIGS. 4B, 4C, and 4D, is reduced.

The configuration of FIGS. 4A, 4B, 4C, and 4D are given for illustrative purposes. Various configurations of the elements mentioned above in FIGS. 4A, 4B, 4C, and 4D are within the contemplated scope of the present disclosure. For example, in various embodiments, the insulating layers 451-452 extends in x direction and y direction.

In some embodiments, the integrated circuit 400 with the configurations as illustrated above includes an area in a layout view about 16% smaller than an area occupied by an integrated circuit with the configurations of some approaches, for those approaches does not include an insulating layer between the gate.

Figure 5:
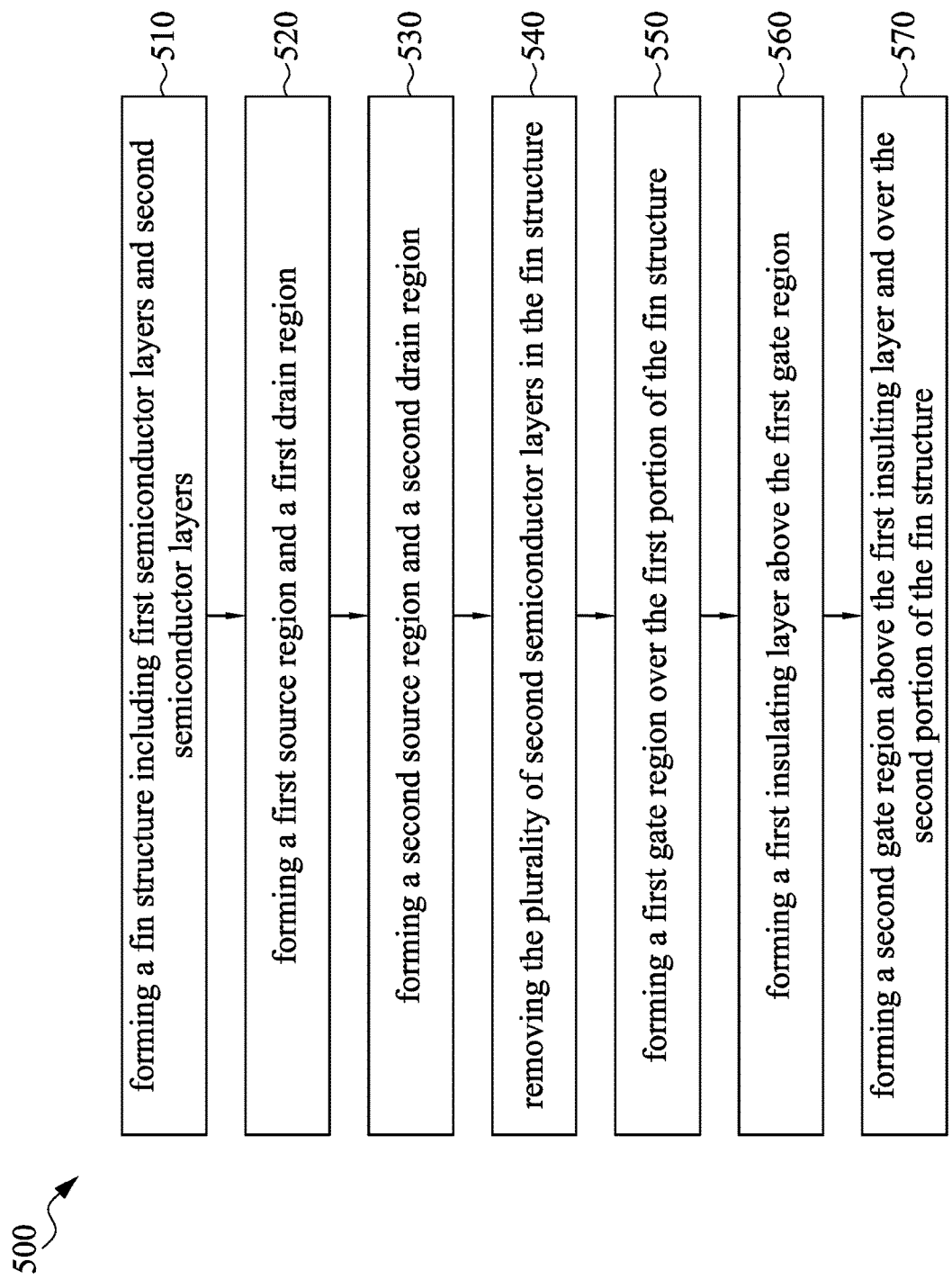
FIG. 5 is a flow chart of a method for manufacturing an integrated circuit, in accordance with some embodiments of the present disclosure.
Figure 6B:
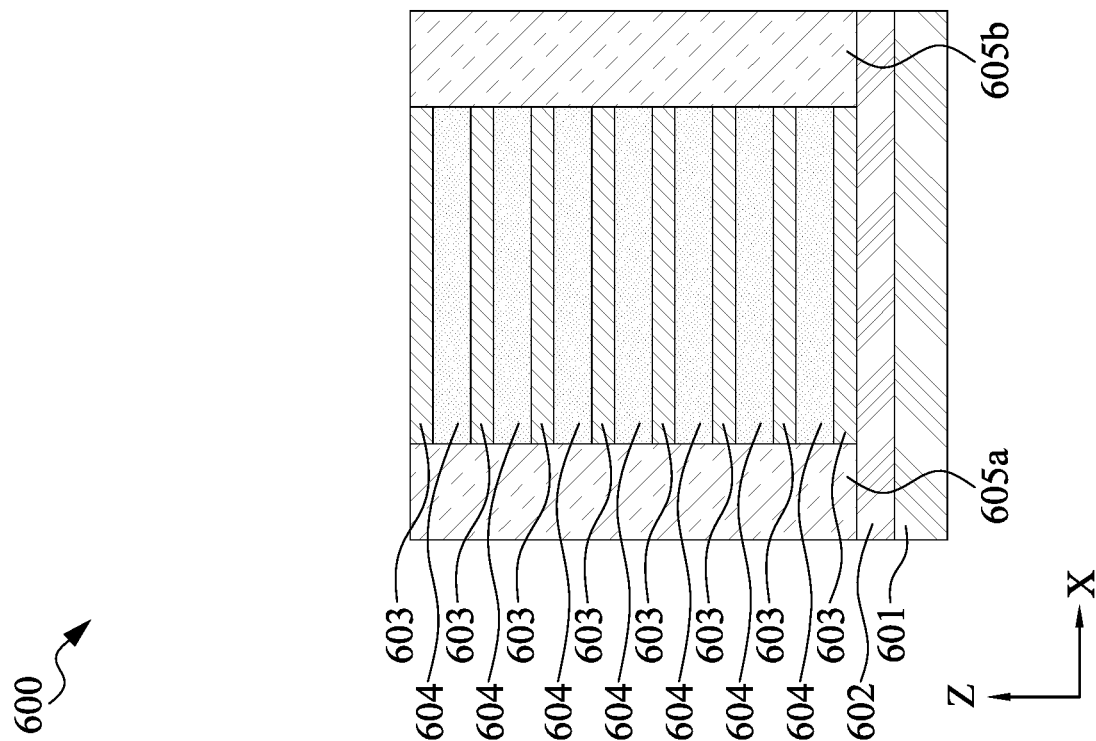
FIGS. 6A to 6S are schematic diagrams, in cross-sectional view of part of an integrated circuit, illustrating various processes of the method of FIG. 5, in accordance with some embodiments of the present disclosure.
Figure 6A:
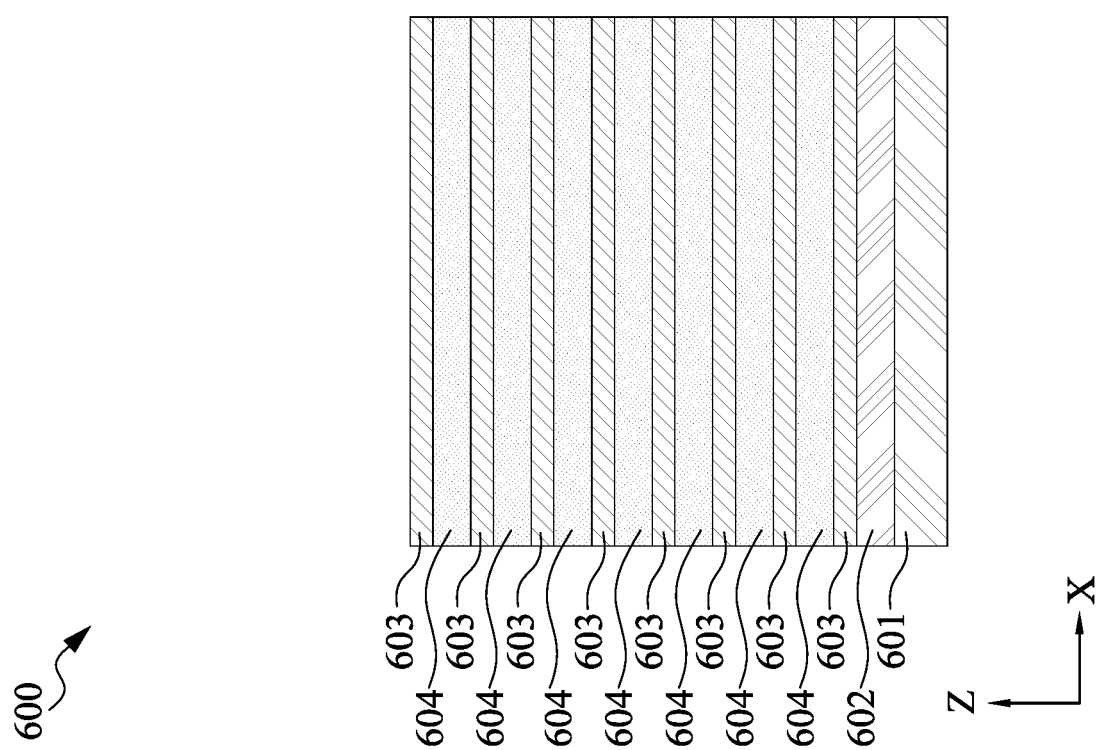
Figure 6D:
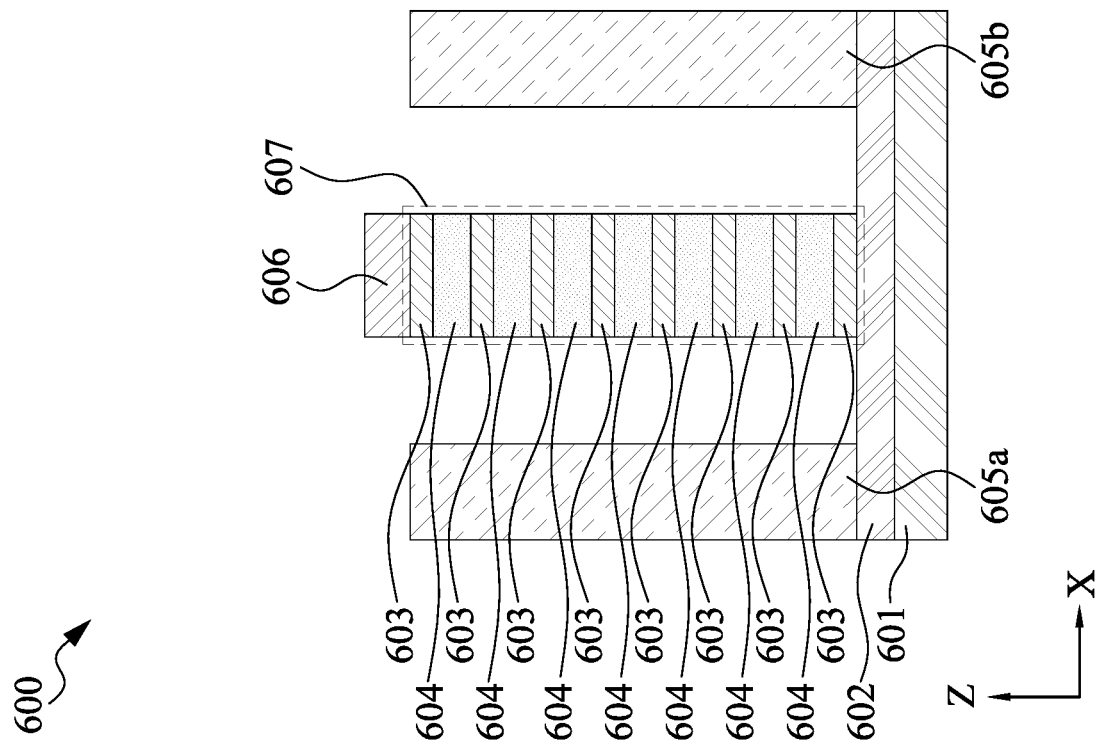
Figure 6C:
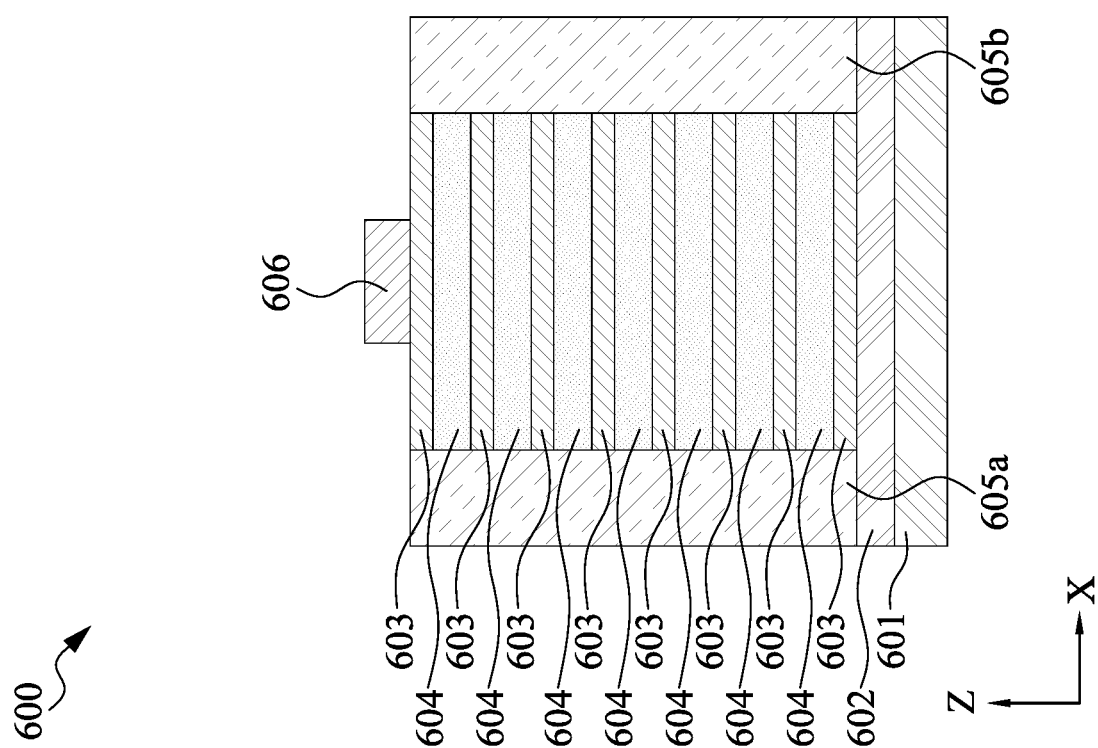
Figure 6F:
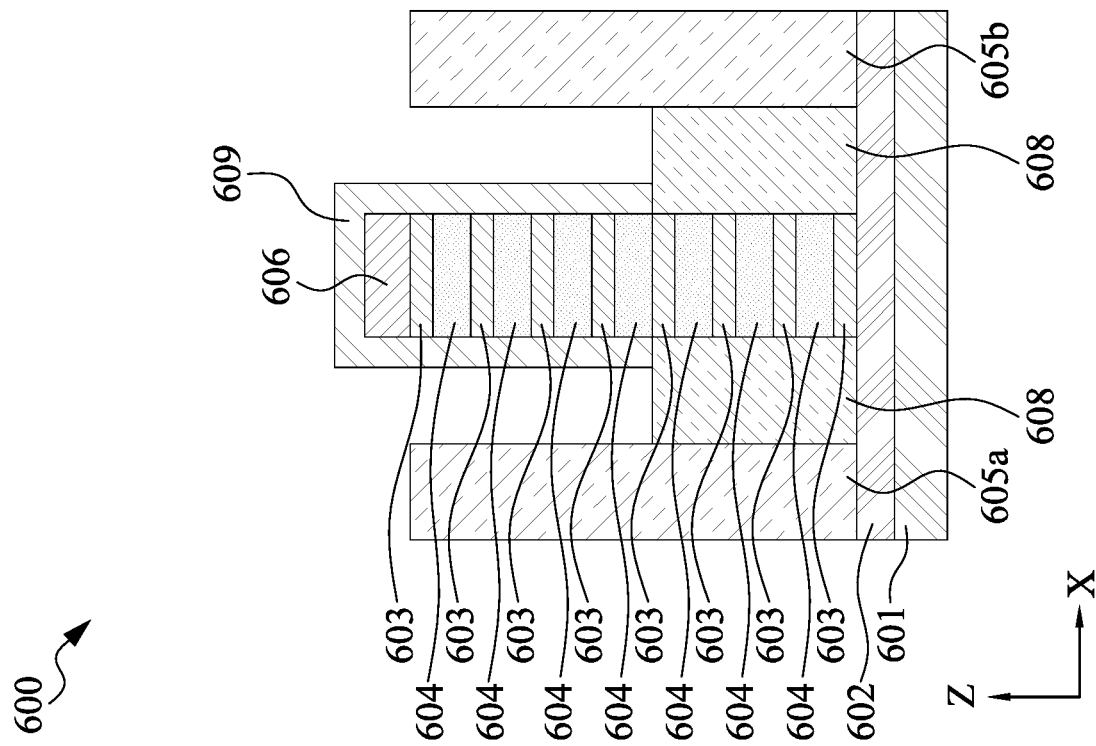
Figure 6E:
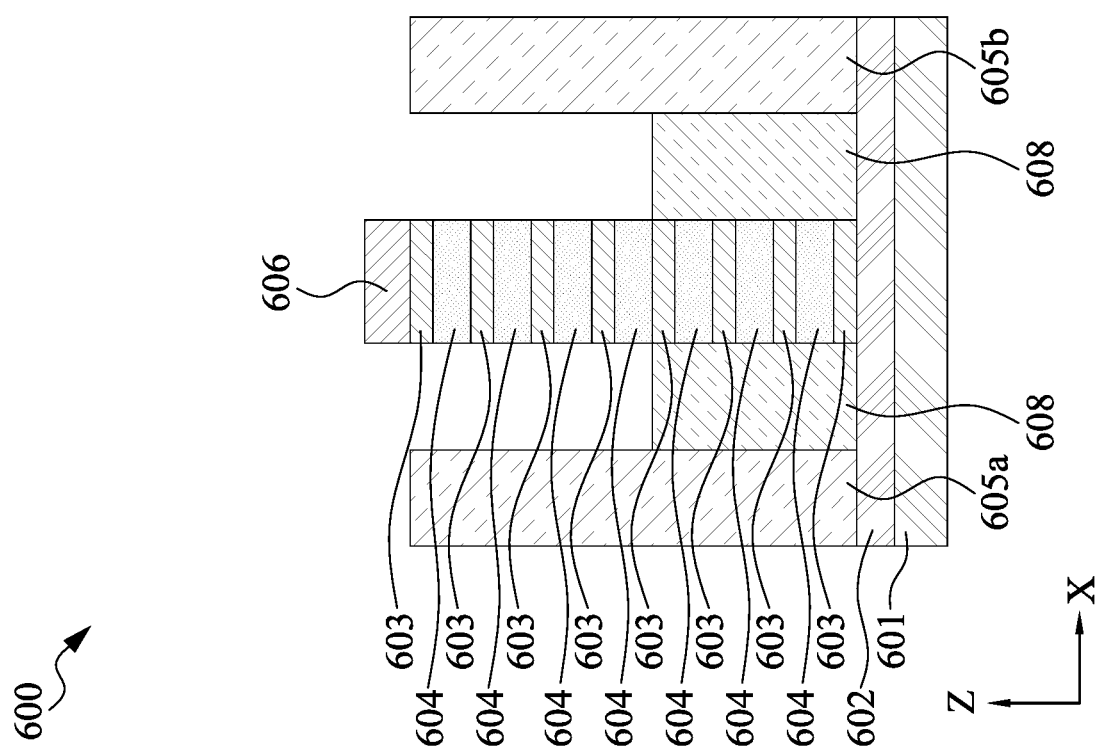
Figure 6H:
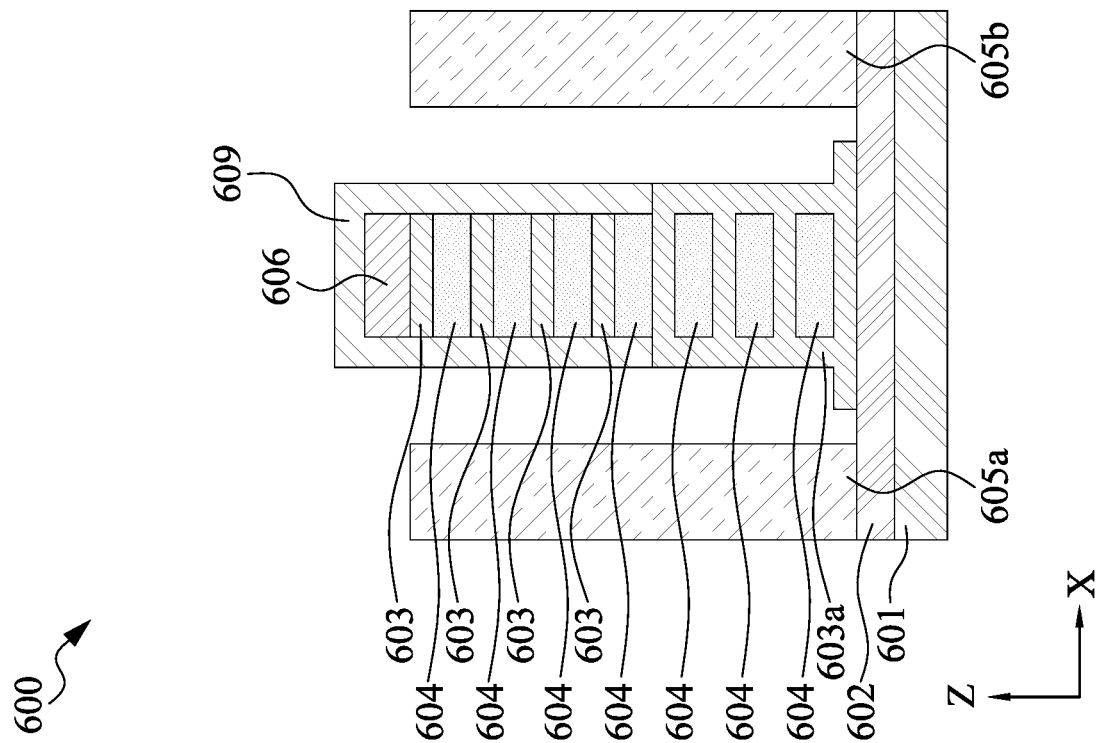
Figure 6G:
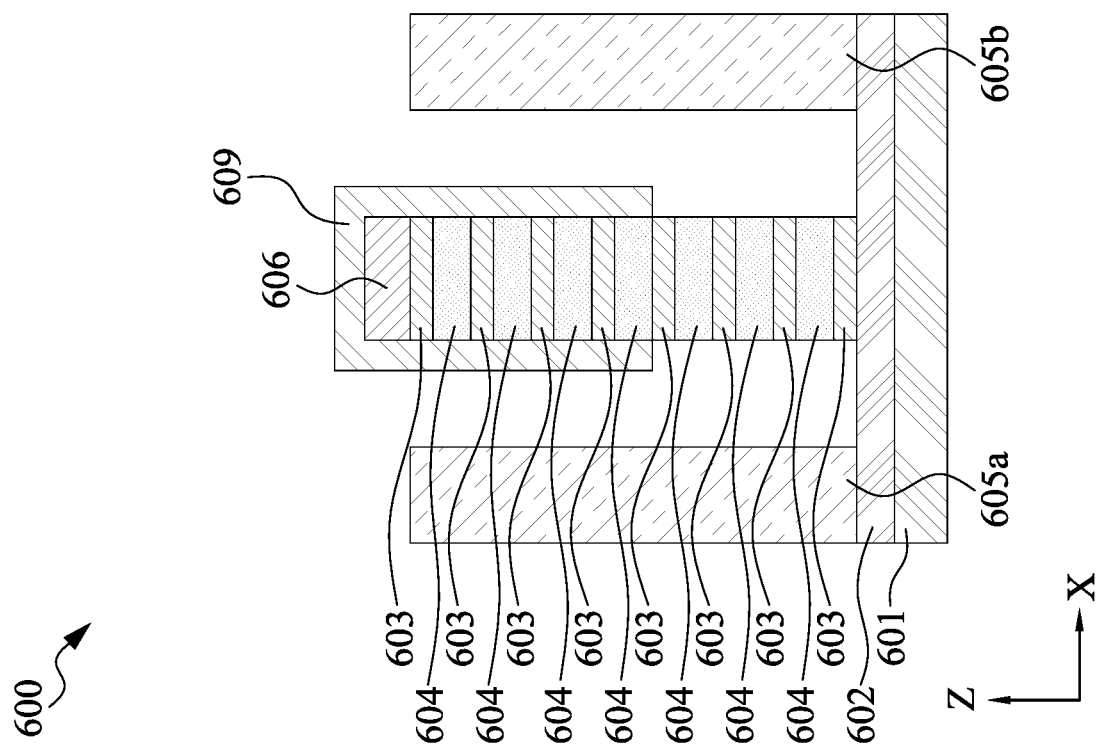
Figure 6J:
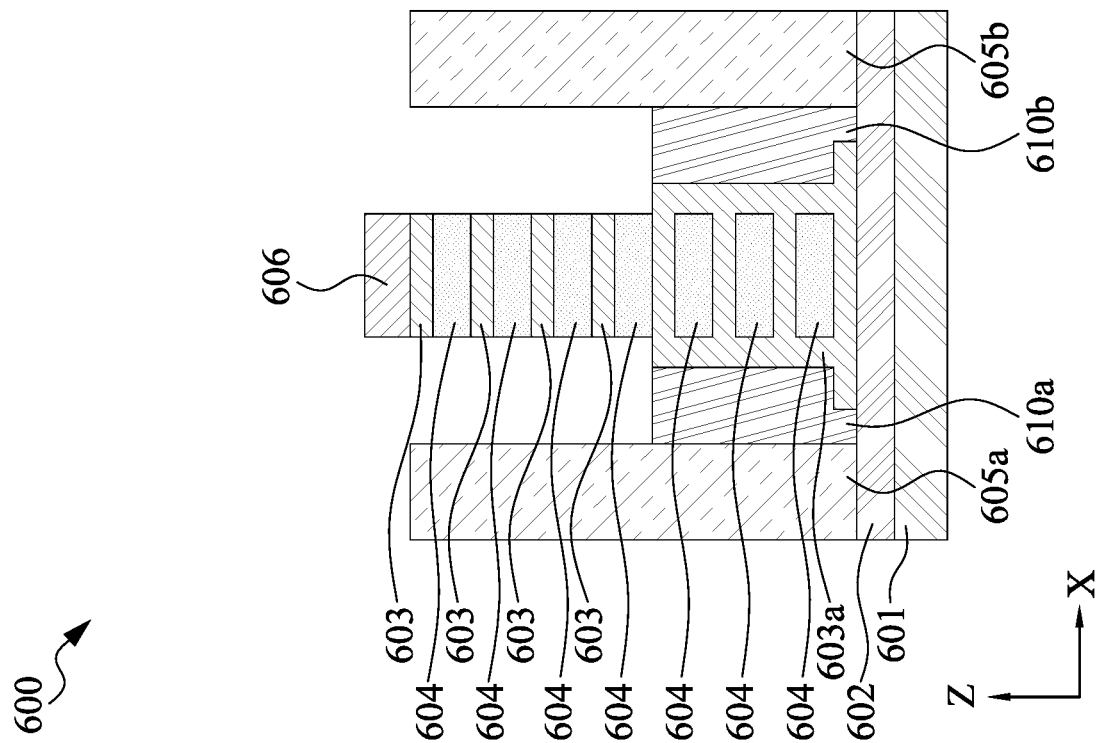
Figure 6I:
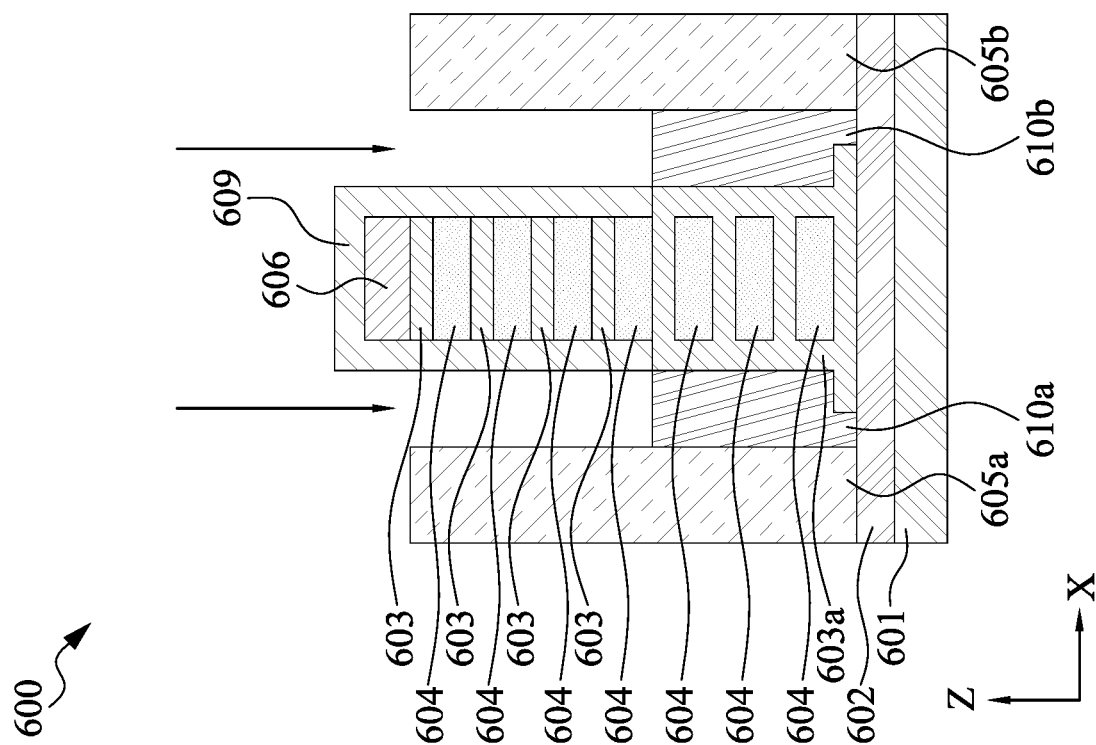
Figure 6L:
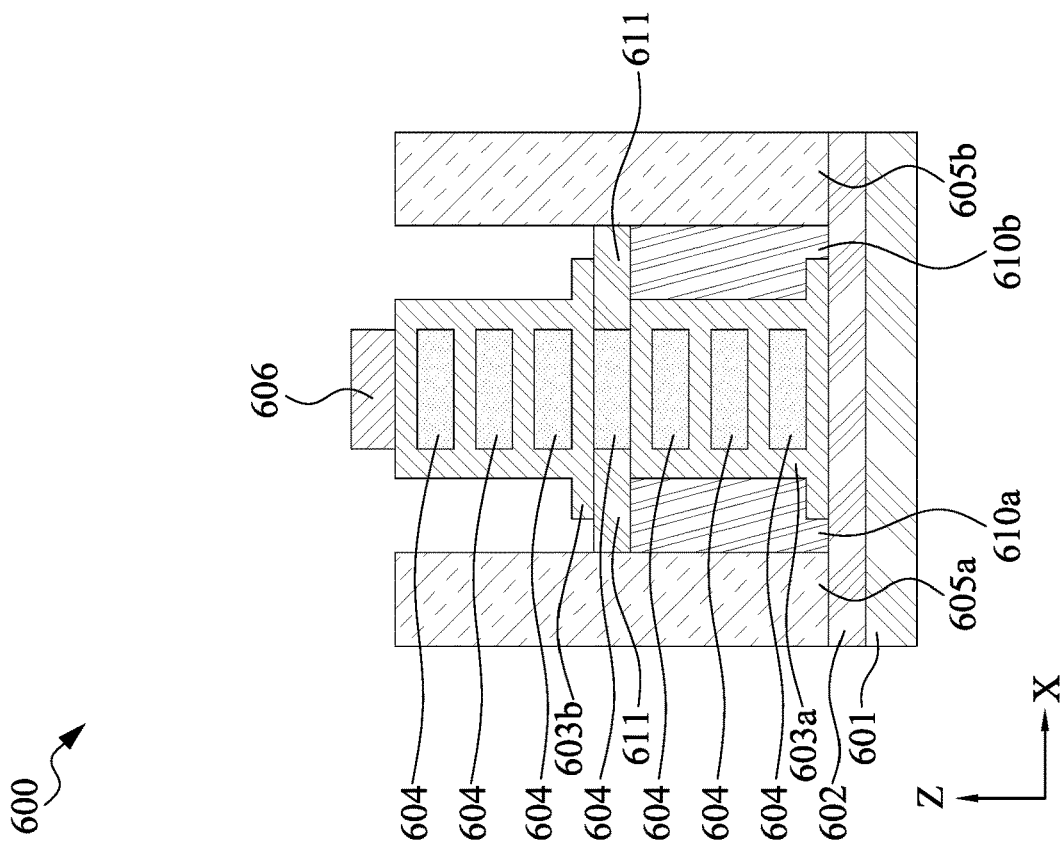
Figure 6K:
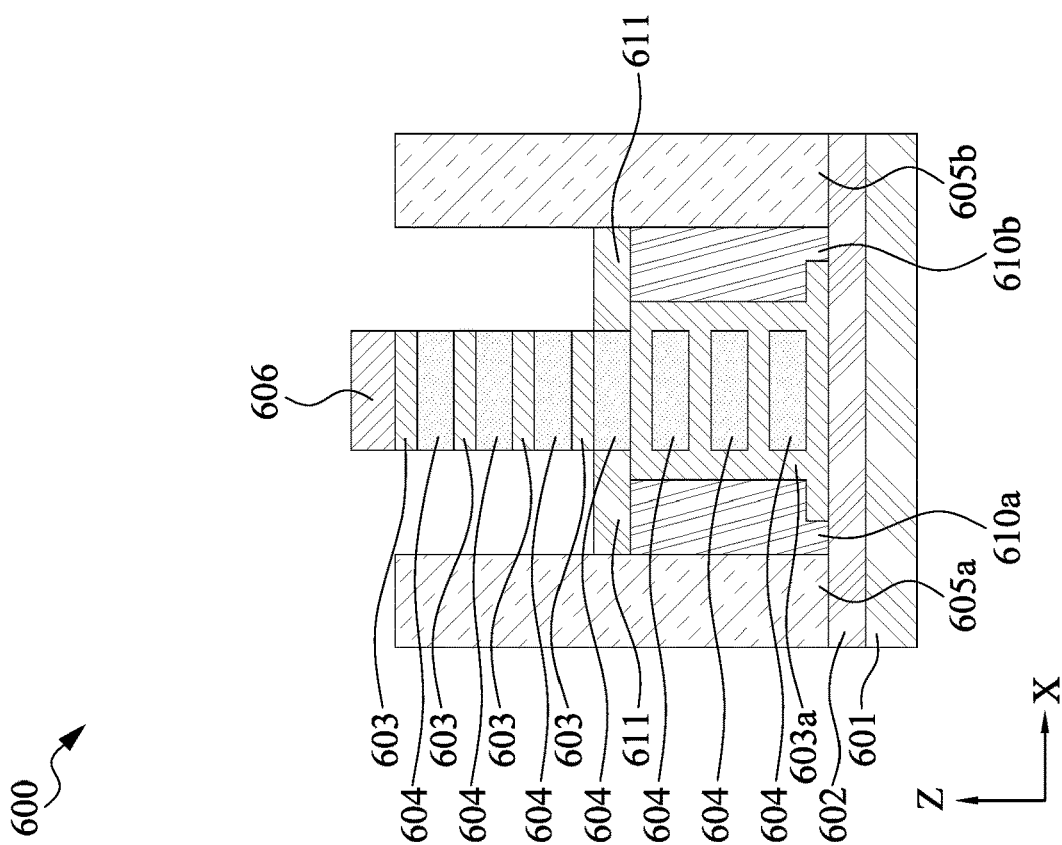
Figure 6M:
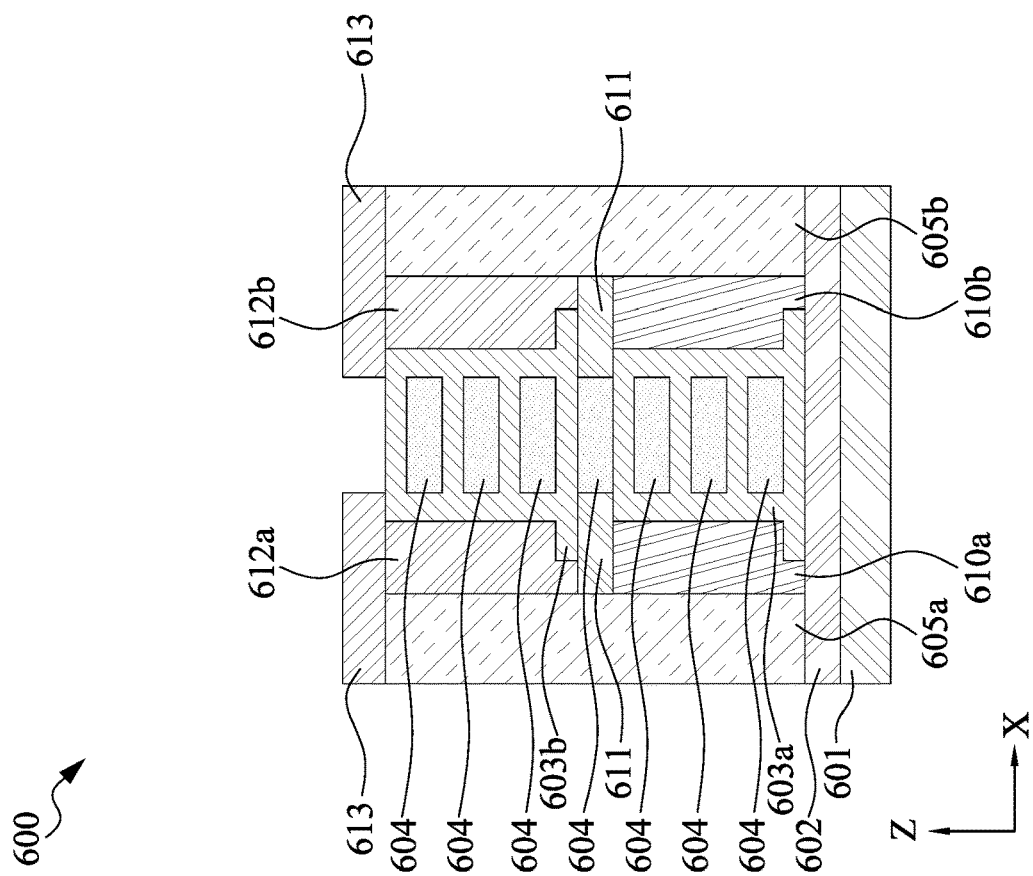
Figure 6N:
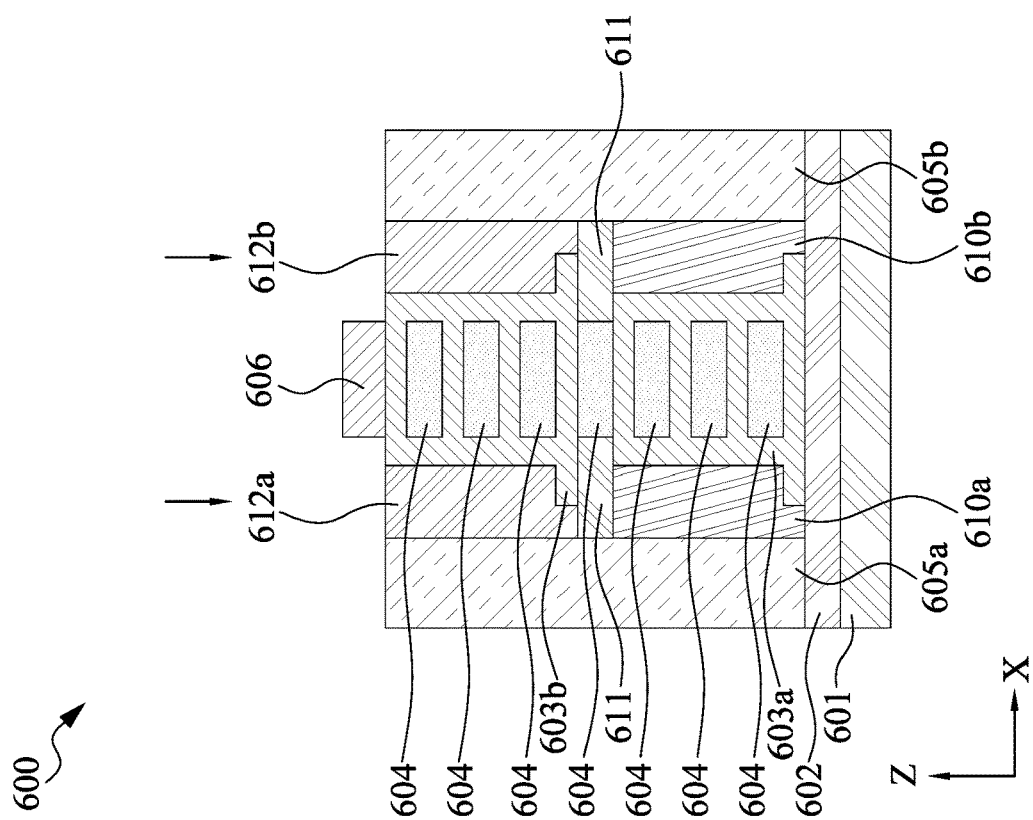
Figure 6S:
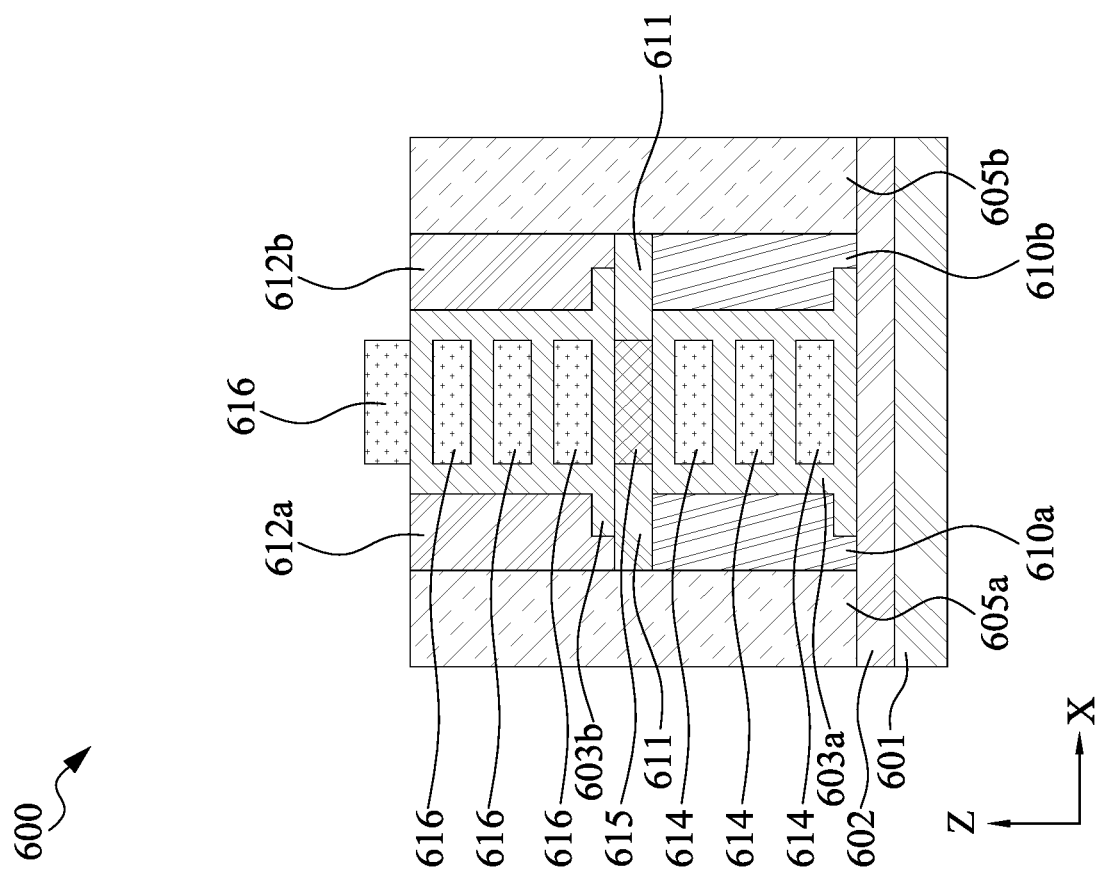

Reference is now made to FIG. 5 and FIGS. 6A to 6S. FIG. 5 is a flow chart of a method 500 for manufacturing the integrated circuit 100, 300, or 400, or an integrated circuit 600 shown in FIGS. 6A to 6S, in accordance with some embodiments of the present disclosure. FIGS. 6A to 6S are schematic diagrams, in cross-sectional view of part of the integrated circuit 600 along x direction (i.e., the source/drain to drain/source direction), illustrating various processes of the method 500 of FIG. 5, in accordance with some embodiments of the present disclosure. It is understood that additional operations can be provided before, during, and after the processes shown by FIG. 5 and FIGS. 6A to 6S, and some of the operations described below can be replaced or eliminated, for additional embodiments of the method. The order of the operations/processes may be interchangeable. Throughout the various views and illustrative embodiments, like reference numbers are used to designate like elements.

In operation 510 of FIG. 5, a multilayer stack in the integrated circuit 600, including first semiconductor layers and second semiconductor layers, is formed by the processes as illustrated in FIGS. 6A to 6D. In some embodiments, the multilayer stack includes, for example, the channel regions of the transistors 110 and 120 of FIG. 1 as discussed above.

The formation of the multilayer stack will be discussed in detail in the following paragraphs with reference to FIGS. 6A to 6D.

For illustration, as shown in FIG. 6A, an insulation 602 is disposed above a substrate 601. The first semiconductor layers 603 and the second semiconductor layers 604 are disposed on the insulation 602 and alternately stacked on each other along z direction. In some embodiments, the first semiconductor layers 603 and the second semiconductor layers 604 are epitaxially grown on the insulation 602.

In some embodiments, the first semiconductor layers 603 and the second semiconductor layers 604 are made of materials having lattice constants different from each other. For example, in some embodiments, the first semiconductor layers 603 are made of silicon and the second semiconductor layers 604 are made of silicon germanium (SiGe). The above materials of the first semiconductor layers 603 and the second semiconductor layers 604 are given for illustrative purposes. Various materials of the first semiconductor layers 603 and the second semiconductor layers 604 are within the contemplated scope of the present disclosure. For example, in various embodiments, the materials for forming the first semiconductor layers 603 and the second semiconductor layers 604 include one or more layers of Ge, GaAs, InSb, GaP, GaSb, InAlAs, InGaAs, GaSbP, GaAsSb or InP.

As shown in FIG. 6B, trenches are defined and formed adjacent to the first semiconductor layers 603 and the second semiconductor layers 604, and shallow trench isolations (STI) 605a-605b are disposed in the trenches. For illustration, the trenches are formed at opposite sides of the first semiconductor layers 603 and the second semiconductor layers 604, such that the shallow trench isolations 605a-605b are formed at the opposite sides of the first semiconductor layers 603 and the second semiconductor layers 604.

Next, as shown in FIG. 6C, a dummy gate pattern 606 is patterned and disposed on an uppermost first semiconductor layer 603 of the first semiconductor layers 603. In some embodiments, the uppermost first semiconductor layers 603 in FIG. 6C is an exposed top layer. In some embodiments, the dummy gate pattern 606 is formed by depositing and patterning a gate mask layer formed over the uppermost first semiconductor layers 603 formed as the exposed top layer. In some embodiments, the dummy gate pattern 606 is made of a silicon nitride (SiN), which is formed by chemical vapor deposition (CVD), including, for example, low pressure CVD (LPCVD) and plasma enhanced CVD (PECVD), physical vapor deposition (PVD), atomic layer deposition (ALD), or other suitable process. The dummy gate pattern 606 is patterned into a mask pattern by using patterning operations including, for example, photo-lithography and etching.

As shown in FIG. 6D, a multilayer stack 607 is formed. In some embodiments, the first semiconductor layers 603 and the second semiconductor layers 604, exposed without the dummy gate pattern 606 disposed on above, are patterned by using patterned mask layers and then etched, such that the first semiconductor layers 603 and the second semiconductor layers 604 below the dummy gate pattern 606 are formed in the multilayer stack 607.

Furthermore, in FIG. 6E, an insulator 608 is formed on opposite sides of a first portion of the multilayer stack 607 along x direction. As shown in FIG. 6E, for illustration, the first portion of the multilayer stack 607 includes a portion of the first semiconductor layers 603 and a portion of the second semiconductor layers 604 that are closer to the substrate 601 and the insulation 602, compared with a second portion of the multilayer stack 607 that is close to the dummy gate pattern 606. In some embodiments, as the two sides of the first portion of the multilayer stack 607 contact the insulator 608, the first portion of the multilayer stack 607 are exposed in y direction.

In some embodiments, the insulating material for the insulator 608 includes, for example, silicon oxide, silicon nitride, silicon oxynitride (SiON), SiOCN, SiCN, fluorine-doped silicate glass (FSG), or dielectric material.

In some embodiments, the formation of the insulator 608 includes, for example, deposition, chemical mechanical polish (CMP) and etches. In various embodiments, the insulator 608 is formed on opposite sides of both of the first portion and the second portion of the multilayer stack 607. After forming the insulator 608, the insulator 608 is recessed, for example, by a dry etching and/or wet etching or other suitable methods, until the bottommost first semiconductor layers 603 included in the second portion of the multilayer stack 607 is exposed.

The numbers of the first semiconductor layers 603 and the second semiconductor layers 604 corresponding to the first portion of the multilayer stack 607, and the numbers of the first semiconductor layers 603 and the second semiconductor layers 604 corresponding to the second portion of the multilayer stack 607, as discussed above with respect to FIG. 6E, are given for illustrative purposes. Various numbers of the first semiconductor layers 603 and the second semiconductor layers 604 corresponding to different portions of the multilayer stack 607 are within the contemplated scope of the present disclosure. For example, in various embodiments, the first portion of the multilayer stack 607 (with the insulator 608 formed at the opposite sides) includes more than four layers of the first semiconductor layers 603 and more than three layers of the second semiconductor layers 604.

As shown in FIG. 6F, for illustration, an insulator 609 is formed above the dummy gate pattern 606 and the two opposite sides of the second portion of the multilayer stack 607. In some embodiment, the insulator 609 contacts the insulator 608. In various embodiments, the formation of the insulator 609 includes, for example, deposition and etches, such as CVD or other suitable methods. In some embodiments, the insulating material of the insulator 609 is silicon nitride-based material, such as SiN, SiON, SiOCN or SiCN and combinations thereof.

In various embodiments, the insulating materials of the insulators 608 and 609 are different from each other and are etched by different etchants. In alternative embodiments, the same etchant have different etch rates between the insulating materials of the insulators 608 and 609. Alternatively stated, the etchant exhibits a high-etch selectivity between the insulators 608 and 609.

In FIG. 6G, for illustration, the insulator 608 is removed. As shown in FIG. 6G, the first portion of the multilayer stack 607 is exposed. In some embodiments, the insulator 608 is removed selectively, for example, by dry etching and/or wet etching.

Next, as shown in FIG. 6H, a side portion of the first semiconductor layers 603 that are included in the first portion of the multilayer stack 607 is formed along z direction and connects the first semiconductor layers 603 corresponding to the first portion of the multilayer stack 607 to each other, to form a first semiconductor structure 603a. The first semiconductor structure 603a contacts in x direction the second semiconductor layers 604 therein. Alternatively stated, the second semiconductor layers 604 are exposed along y direction. In some embodiments, the first semiconductor structure 603a is epitaxial growth on the insulation 602.

In operation 520 of FIG. 5, a first drain region 610a and a first source region 610b are formed on opposing sides of the first portion of the multilayer stack 607, as shown in FIG. 6I. In some embodiments, the first drain region 610a and the first source region 610b are disposed abutted to the first semiconductor structure 603a. In some embodiments, the first drain region 610a and the first source regions 610b are configured with respect to, for example, the active areas 111 and 112 of FIG. 1 as discussed above.

In various embodiments, the formation of the first drain region 610a and the first source region 610b includes, for example, deposition and etches. The configurations of the first drain region 610a and the first source region 610b are given for illustrative purposes, but the present disclosure is not limited thereto. For example, in some embodiments, the first drain region 610a and the first source region 610b are disposed on alternate position with respect to the first drain region 610a and the first source region 610b of FIG. 6I.

In some embodiments, each one of the first drain region 610a and the first source region 610b includes one or more layers of Si, SiP, SiC and SiCP for an n-type FET or Si, SiGe, Ge for a p-type FET. The first drain region 610a and the first source region 610b are formed by an epitaxial growth method using CVD, ALD or molecular beam epitaxy (MBE), and etch. In some embodiments, the formation of the first drain region 610a and the first source region 610b includes ion implantation in a vertical direction (indicated by arrays in FIG. 6I) with ions composed of dopants of n and p types for the NMOS and PMOS respectively. In some embodiments, the first drain region 610a and the first source region 610b are included in the n-type FET with respect to, for example, the transistor 110 of FIG. 1.

In various embodiments, the first drain region 610a and the first source region 610b are formed on opposite sides of both of the first portion and the second portion of the multilayer stack 607. After forming the first drain region 610a and the first source region 610b, the first drain region 610a and the first source region 610b are recessed, by a dry etching and/or wet etching or other suitable methods, until reaching a level of the interface of the first semiconductor structure 603a and the insulator 609.

Moreover, in FIG. 6J, for illustration, the insulator 609 is removed. As shown in FIG. 6J, the dummy gate pattern 606 and the second portion of the multilayer stack 607 are exposed. In some embodiments, the insulator 609 is removed, for example, by dry etching and/or wet etching.

In FIG. 6K, for illustration, an insulator 611 is formed on the first drain region 610a and the first source region 610b. In some embodiments, the insulator 611 is arranged at two opposite sides of at least one layer of the second semiconductor layers 604. In various embodiments, the formation of the insulator 611 includes, for example, the deposition and etches. In some embodiments, the insulator 611 is made of a silicon nitride (SiN), which is formed by CVD, including, for example, low pressure CVD (LPCVD) and plasma enhanced CVD (PECVD), physical vapor deposition (PVD), atomic layer deposition (ALD), or other suitable process.

Next, as shown in FIG. 6L, a side portion of the first semiconductor layers 603 that are included in the second portion of the multilayer stack 607 is formed and connects each layer of the first semiconductor layers 603 to adjacent layer of the first semiconductor layers 603 to form a second semiconductor structure 603b. The second semiconductor structure 603b surrounds the second semiconductor layers 604 therein. In some embodiments, the second semiconductor structure 603b is epitaxial growth on the insulator 611.

In operation 530 of FIG. 5, a second drain region 612a and a second source region 612b are formed on opposing sides of the second portion of the multilayer stack 607, as shown in FIG. 6M. In some embodiments, the second drain region 612a and the second source region 612b are disposed abutted to the second semiconductor structure 603b. In some embodiments, the second drain region 612a and the second source regions 612b are configured with respect to, for example, the active areas 121 and 122 of FIG. 1 as discussed above. In various embodiments, the formation of the second drain region 612a and the second source region 612b includes, for example, deposition, ion implantation, chemical mechanical polish and etches, as illustrated with respect to the first drain region 610a and the first source region 610b.

Moreover, in FIG. 6N, the dummy gate pattern 606 is removed and an insulator 613 is disposed on the shallow trench isolations 605a-605b, the second drain region 612a, the second source region 612b, and the second semiconductor structure 603b. In some embodiments, the dummy gate pattern 606 is removed, for example, by dry etching and/or wet etching. The insulator 613 is formed by, for example, CVD process, and patterned into a mask pattern by using patterning operations including photo-lithography and etching.

In operation 540 of FIG. 5, the second semiconductor layers 604 of the multilayer stack 607 are removed, such that spaces between two adjacent layers of the first semiconductor layers 603 are provided, as shown in FIG. 6O. Specifically, before the operation 540, the second semiconductor layers 604 of the multilayer stack 607 are exposed in y direction. Accordingly, in some embodiments, the second semiconductor layers 604 are removed or etched through, along y direction, using a wet etchant that can selectively etch the second semiconductor layers 604 against the first semiconductor layers 603. The wet etchant is such as, but not limited to, ammonium hydroxide (NH4OH), tetramethylammonium hydroxide (TMAH), ethylenediamine pyrocatechol (EDP), or potassium hydroxide (KOH) solution. Alternatively stated, the etching of the second semiconductor layers 604 (e.g., SiGe) stops at the first semiconductor layers 603.

With the configurations of FIG. 6O, in some embodiments, the first semiconductor structure 603a is electrically insulated from the second semiconductor structure 603b by the insulator 611.

In some embodiments, the multilayer stack 607 is implemented by, for example, including structures of round/square wire, nanoslab, nano-sheet, multi-bridge channel, nano-ring or any other suitable kinds of the nano structures.

In operation 550 of FIG. 5, a first gate region 614 over the first portion of the multilayer stack 607 is formed, as shown in FIG. 6P. As shown in FIG. 6P, the first gate region 614 is filled in the first semiconductor structure 603a. The first gate region 614 is configured with respect to, for example, the gate 113 of FIG. 1. In some embodiments, the first gate region 614 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the formation of the first gate region 614 includes, for example, CVD, ALD, electro-plating, or other suitable method.

In some embodiments, before the first gate region 614 is formed, a gate dielectric layer (not shown) is formed in the first semiconductor layers 603 and surrounding the inner part of the first semiconductor layer 603. The first gate region 614 is further formed in the gate dielectric layer. In some embodiments, the gate dielectric layer includes one or more layers of a dielectric material, such as silicon oxide, silicon nitride, or high-k dielectric material, other suitable dielectric material, and/or combinations thereof. Examples of high-k dielectric material include HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-k dielectric materials, and/or combinations thereof. In some embodiments, the gate dielectric layer 102 includes an interfacial layer formed between the channel layers and the dielectric material.

In various embodiments, the formation of the gate dielectric layer includes, for example, CVD, ALD or any suitable method. In one embodiment, the gate dielectric layer is formed using a highly conformal deposition process such as ALD in order to ensure the formation of a gate dielectric layer having a uniform thickness around each channel layers including the first semiconductor layer 603. The thickness of the gate dielectric layer is in a range from about 1 nm to about 6 nm in one embodiment.

In operation 560 of FIG. 5, an insulating layer 615 is formed above the first gate region 614, as shown in FIG. 6Q. The insulating layer 615 is configured with respect, for example, the insulating layer 130 of FIG. 1. For illustration, the insulating layer 615 is surrounded by the insulator 611. In some embodiments, the insulating layer 615 is formed by filling a space between first semiconductor structure 603a and the second semiconductor structure 603b with an insulating material. In various embodiments, the formation of the insulating layer 615 includes, for example, deposition, chemical mechanical polish, and etches.

In operation 570 of FIG. 5, a second gate region 616 over the second portion of the multilayer stack 607 is formed, as shown in FIG. 6R. As shown in FIG. 6R, the second gate region 616 is filled in the second semiconductor structure 603b and disposed above the exposed top layer of the first semiconductor layers 603. The second gate region 616 is configured with respect to, for example, the gate 123 of FIG. 1. In some embodiments, the second gate region 616 includes, for example, a gate dielectric layer contacting the first semiconductor layers 603 surrounding the second gate region 616. In various embodiments, the formation of the second gate region 616 includes, for example, deposition, chemical mechanical polish, and etches.

In some embodiments, the first gate region 614 and the second gate region 616 are formed by the same gate material. However, the scope of the disclosure is not intended to be limiting of the present disclosure. For example, the first gate region 614 and the second gate region 616 are formed by different gate materials.

With the configurations of FIG. 6R, in some embodiments, the first gate region 614 is electrically insulated from the second gate region 616 by the insulating layer 615.

Furthermore, for illustration, in FIG. 6S, the insulator 613 is removed. As shown in FIG. 6S, the shallow trench isolations 605a-605b, the second drain region 612a, the second source region 612b, and the second semiconductor structure 603b are exposed.

As described above, the integrated circuit in the present disclosure is provided with an insulating layer between at least two gates, in which the at least two gates are stacked vertically. The insulating layer insulates electrically one gate from another gate of the at least two gates, such that the routing arrangements between the at least two gates are simplified. Accordingly, the required area in a plan view for the integrated circuit is reduced.

Figure 7:
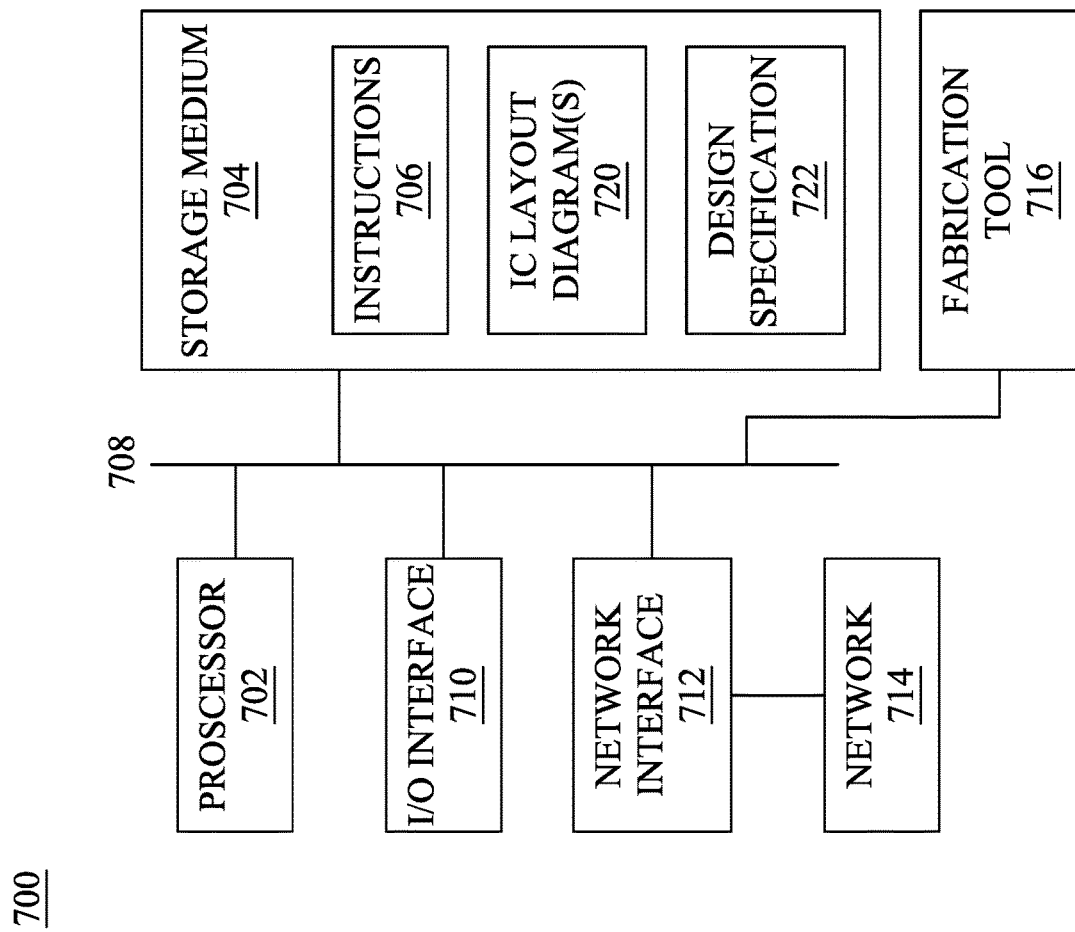
FIG. 7 is a block diagram of an IC device design system, in accordance with some embodiments of the present disclosure.

FIG. 7 is a block diagram of an IC device design system 700, in accordance with some embodiments of the present disclosure. One or more operations of the method as discussed above with respect to FIG. 5 are implementable using the IC device design system 700, in accordance with some embodiments.

In some embodiments, IC device design system 700 is a computing device including a hardware processor 702 and a non-transitory computer-readable storage medium 704. Non-transitory computer-readable storage medium 704, amongst other things, is encoded with, i.e., stores, computer program codes, i.e., a set of executable instructions 706. Execution of instructions 706 by the hardware processor 702 represents (at least in part) an IC device design system which implements a portion or all of, e.g., the method discussed above with respect to FIG. 5. (hereinafter, the noted processes and/or methods).

Processor 702 is electrically coupled to non-transitory computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and non-transitory, computer-readable storage medium 704 are capable of being connected to external elements via network 714. Processor 702 is configured to execute the instructions 706 encoded in non-transitory computer-readable storage medium 704 in order to cause IC device design system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, non-transitory computer-readable storage medium 704 is an electronic, magnetic, optical, electromagnetic, infrared, and/or a semiconductor system (or apparatus or device). For example, non-transitory computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 704 includes a compact disk-read only memory (CD-ROM), a compact disk-read/write (CD-R/W), and/or a digital video disc (DVD).

In one or more embodiments, non-transitory computer-readable storage medium 704 stores the instructions 706 configured to cause IC device design system 700 to be usable for performing a portion or all of the noted processes and/or methods. In one or more embodiments, non-transitory computer-readable storage medium 704 also stores information which facilitates performing a portion or all of the noted processes and/or methods. In various embodiments, non-transitory computer-readable storage medium 704 stores one or a combination of at least one IC layout designs 720 or at least one design specification 722, each discussed above with respect to FIGS. 3A-4D and the method in FIG. 5.

IC device design system 700 includes I/O interface 710. I/O interface 710 is coupled to external circuitry. In various embodiments, I/O interface 710 includes one or a combination of a keyboard, keypad, mouse, trackball, trackpad, display, touchscreen, and/or cursor direction keys for communicating information and commands to and/or from processor 702.

IC device design system 700 also includes network interface 712 coupled to processor 702. Network interface 712 allows IC device design system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 700.

IC device design system 700 is configured to receive information through I/O interface 710. The information received through I/O interface 710 includes one or a combination of at least one design rule instructions, at least one set of criteria, at least one design rule, at least one DRM, and/or other parameters for processing by processor 702. The information is transferred to processor 702 via bus 708. IC device design system 700 is configured to transmit and/or receive information related to a user interface through I/O interface 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of the method in FIG. 5, IC device design system 700 and a non-transitory computer-readable storage medium, e.g., non-transitory computer-readable storage medium 704, enable the benefits discussed above with respect to the method in FIG. 5.

Figure 8:
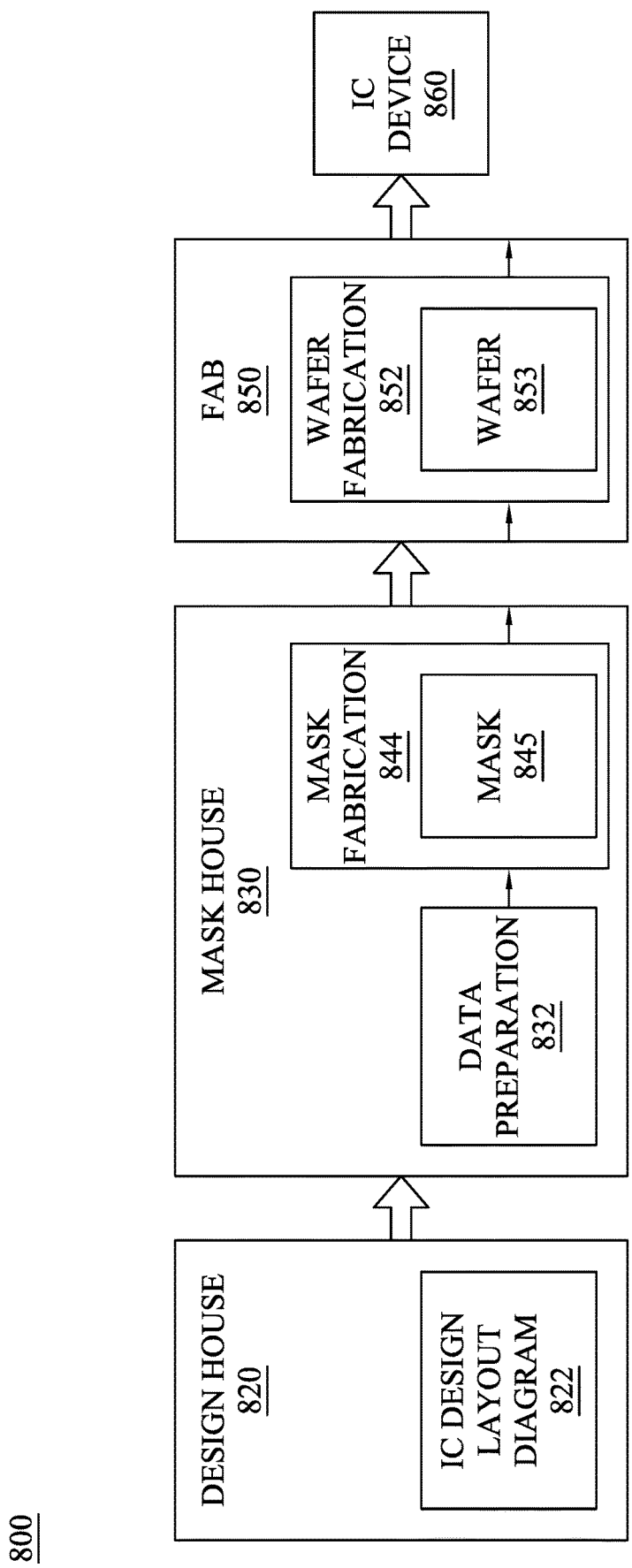
FIG. 8 is a block diagram of IC manufacturing system 800, and an IC manufacturing flow associated therewith, in accordance with some embodiments of the present disclosure.

FIG. 8 is a block diagram of IC manufacturing system 800, and an IC manufacturing flow associated therewith, in accordance with some embodiments of the present disclosure. In some embodiments, based on a layout design, at least one of (A) one or more semiconductor masks or (B) at least one component in a layer of a semiconductor integrated circuit is fabricated using the IC manufacturing system 800.

In FIG. 8, the IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram (or design) 822 based on the method in FIG. 5, discussed above with respect to FIGS. 3A-4D. IC design layout diagram 822 includes various geometrical patterns that correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure including the method in FIG. 5, discussed above with respect to FIGS. 3A-4D, to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

An integrated circuit is provided and includes a first gate arranged in a first layer and a second gate arranged in a second layer above the first layer, wherein the first and second gates extend in a first direction; a first insulating layer interposed between the first and second gates, wherein the first insulating layer, a first portion of the first gate, and a first portion of the second gate overlap with each other in a layout view; a cut layer, different from the first insulating layer, disposed on a second portion of the first gate; a first via passing through the cut layer and coupled to the second portion of the first gate; and a second via overlapping the first portion of the first gate and the first portion of the second gate, and coupled to the second gate. The first and second vias are configured to transmit different control signals to the first and second gates.

Also disclosed is an integrated circuit that includes a first transistor that is disposed in a first layer and comprises a first gate; a second transistor that is disposed in a second layer above the first layer and comprises a second gate, wherein the first transistor, the second transistor, or the combination thereof has a fin structure; a first insulating layer having a first surface contacting the first gate and a second surface, opposite of the first surface, contacting the second gate; a first via coupled to the first gate and configured to transmit a first control signal to the first gate; and a second via coupled to the second gate and configured to transmit a second control signal, different from the first control signal, to the second gate.

Also disclosed is an integrated circuit that includes a first transistor having a first gate and a second transistor having a second gate that are disposed in a first layer; and a third transistor having a third gate and a fourth transistor having a fourth gate that are disposed in a second layer above the first layer, wherein the first to fourth transistors have fin structures. The first and second transistors have a first conductivity type, and third and fourth transistors have a second conductivity type different from the first conductivity type. A first insulating layer is interposed between the first and third gates and exposes a portion of the first gate to couple to a first control signal, and a second insulating is interposed between the second and fourth gates and exposes a portion of the second gate to receive to a second control signal different from the first control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first gate arranged in a first layer and a second gate arranged in a second layer above the first layer, wherein the first and second gates extend in a first direction;
a first insulating layer interposed between the first and second gates, wherein the first insulating layer, a first portion of the first gate, and a first portion of the second gate overlap with each other in a layout view;
a cut layer that is different from the first insulating layer, disposed on a second portion of the first gate, and in contact with the second gate;
a first via passing through the cut layer and coupled to the second portion of the first gate; and
a second via overlapping the first portion of the first gate and the first portion of the second gate, and coupled to the second gate,
wherein the first and second vias are configured to transmit different control signals to the first and second gates.

2. The integrated circuit of claim 1, further comprising:
a first conductive segment and a second conductive segment that are disposed in a third layer above the second layer,
wherein the first conductive segment is coupled to the first via, and the second conductive segment is coupled to the second via.

3. The integrated circuit of claim 2, wherein the first and second conductive segments extend in a second direction different from the first direction,
wherein the second conductive segment overlaps the second via, the first portion of the first gate, and the first portion of the second gate in the layout view.

4. The integrated circuit of claim 1, wherein the first gate is included in a first transistor of a first conductivity type and the second gate is included in a second transistor of a second conductivity type different from the first conductivity type.

5. The integrated circuit of claim 4, further comprising:
a third gate that extends across the first and second layers in a second direction different from the first direction and is shared by third and fourth transistors,
wherein the third gate is coupled to the second gate.

6. The integrated circuit of claim 5, wherein the third transistor is configured to turn on to electrically couple a terminal of the first transistor to terminals of the second and fourth transistors.

7. The integrated circuit of claim 1, further comprising:
a third gate arranged in the first layer and a fourth gate arranged in the second layer, wherein the third and fourth gates extend in the first direction; and
a second insulating layer interposed between the third and fourth gates, wherein the second insulating layer, a first portion of the third gate, and a first portion of the fourth gate overlap with each other in the layout view,
wherein the third gate is coupled to the second gate through first and second conductive segments arranged in a third layer above the second layer.

8. The integrated circuit of claim 7, wherein the fourth gate is coupled to the first gate through third and fourth conductive segments arranged in the third layer.

9. The integrated circuit of claim 8, further comprising:
fifth and sixth conductive segments that are arranged in a fourth layer above the third layer and extend in the first direction,
wherein the fifth conductive segment is electrically coupled between the first and second conductive segments, and
the sixth conductive segment is electrically coupled between the third and fourth conductive segments.

10. An integrated circuit, comprising:
a first transistor that is disposed in a first layer and comprises a first gate;
a second transistor that is disposed in a second layer above the first layer and comprises a second gate, wherein the first transistor, the second transistor, or the combination thereof has a fin structure;
a first insulating layer having a first surface contacting the first gate and a second surface, opposite of the first surface, contacting the second gate;
a first via that is separated from the first insulating layer along a first direction, coupled to the first gate, and configured to transmit a first control signal to the first gate; and
a second via coupled to the second gate and configured to transmit a second control signal, different from the first control signal, to the second gate.

11. The integrated circuit of claim 10, further comprising:
a first cut layer, different from the first insulating layer, filled in a first opening adjacent to the first insulating layer and the second gate; and
a first conductive segment arranged in a third layer above the second transistor, wherein the first via passes through the first cut layer to electrically couple the first conductive segment to the first gate.

12. The integrated circuit of claim 11, further comprising:
a second cut layer, different from the first cut layer and the first insulating layer, filled in a second opening adjacent to the first insulating layer and the second gate.

13. The integrated circuit of claim 11, further comprising:
a second conductive segment arranged in the third layer, wherein the second via electrically couples the second conductive segment to the second gate.

14. The integrated circuit of claim 10, further comprising:
a first conductive segment arranged in a third layer above the second transistor, wherein the first via electrically couples the first conductive segment to the first gate;
a second conductive segment arranged in the third layer, wherein the second via electrically couples the second conductive segment to the second gate; and
third to fifth conductive segments arranged interposed between the first and second conductive segments in the third layer and overlapping the first insulating layer and the first to second gates in a layout view.

15. The integrated circuit of claim 14, wherein the first and second gates extend in the first direction,
wherein the first to fifth conductive segments extend in a second direction different from the first direction, and the first to fifth conductive segments are separated from each other in first direction.

16. The integrated circuit of claim 10, further comprising:
a third transistor that is disposed in the first layer and comprises a third gate;
a fourth transistor that is disposed in the second layer and comprises a fourth gate; and
a second insulating layer having a first surface contacting the third gate and a second surface, opposite of the first surface, contacting the fourth gate,
wherein the third and fourth transistors have a same conductivity type, and the first and third transistors have a same conductivity type.

17. An integrated circuit, comprising:
a first transistor having a first gate and a second transistor having a second gate that are disposed in a first layer; and
a third transistor having a third gate and a fourth transistor having a fourth gate that are disposed in a second layer above the first layer, wherein the first to fourth transistors have fin structures,
wherein the first and second transistors have a first conductivity type, and third and fourth transistors have a second conductivity type different from the first conductivity type,
wherein a first insulating layer is interposed between the first and third gates and exposes a portion of the first gate to couple to a first control signal, and
a second insulating layer is different from the first insulating layer, interposed between the second and fourth gates, and exposes a portion of the second gate to receive a second control signal different from the first control signal.

18. The integrated circuit of claim 17, further comprising:
a first pair of conductive segments arranged in a third layer above the third and fourth transistors to transmit the first control signal to the fourth gate.

19. The integrated circuit of claim 18, further comprising:
a second pair of conductive segments arranged in the third layer to transmit the second control signal to the third gate.

20. The integrated circuit of claim 17, further comprising:
a via interposed between the first and second insulating layers to electrically couple terminals of the first to fourth transistors together,
wherein the via is arranged between the first and second layers.

\* \* \* \* \*